US005751318A

United States Patent [19]

Granzow

[11] Patent Number: 5,751,318
[45] Date of Patent: May 12, 1998

[54] ELONGATED INK JET PRINTHEAD USING JOINED PIEZOELECTRIC ACTUATOR

[75] Inventor: Daniel B. Granzow, Spring, Tex.

[73] Assignee: Compag Computer Corporation, Houston, Tex.

[21] Appl. No.: 510,711

[22] Filed: Aug. 3, 1995

Related U.S. Application Data

[62] Division of Ser. No. 66,908, May 25, 1993, Pat. No. 5,438, 739.

[51] Int. Cl.[6] .......... H01L 41/22
[52] U.S. Cl. .......... 347/68
[58] Field of Search .......... 347/68, 69, 71, 347/72

[56] References Cited

U.S. PATENT DOCUMENTS

| | | | |
|---|---|---|---|
| 5,193,256 | 3/1993 | Ochiai et al. | 29/25.35 |
| 5,235,352 | 8/1993 | Pies et al. | 346/140 R |
| 5,365,645 | 11/1994 | Walker et al. | 29/25.35 |
| 5,505,364 | 4/1996 | Plesinger | 228/121 |
| 5,543,009 | 8/1996 | Hayes | 156/268 |

*Primary Examiner*—Daniel P. Malley
*Attorney, Agent, or Firm*—Vinson & Elkins L.L.P.

[57] ABSTRACT

A sidewall actuated channel array for a high density ink jet printhead includes a top wall, bottom wall and a plurality of liquid confining channels formed between columns of polarized piezoelectric material. The array is formed from a plurality of sheets of polarized piezoelectric material which are joined together. Several embodiments are provided for distributing the joints between sheets of piezoelectric material to reduce the magnitude of the electric field needed to polarize the piezoelectric material.

15 Claims, 16 Drawing Sheets

ELONGATED INK JET PRINTHEAD USING JOINED PIEZOELECTRIC ACTUATOR

This application is a divisional application of Ser. No. 08/066,908, filed May 25, 1993, now U.S. Pat. No. 5,438, 739, issued Aug. 8, 1995, entitled "METHOD OF MAKING AN ELONGATED INK JET PRINTHEAD."

CROSS-REFERENCE TO RELATED APPLICATIONS

This application is related to co-pending U.S. patent application Ser. No. 748,220 to Pies et al (Atty. Docket No. 09447/0049, P-257), filed Aug. 16, 1991, entitled HIGH DENSITY INK JET PRINTHEAD, U.S. patent application Ser. No. 746,521 to Pies et al (Atty. Docket No. 09447/0036, P255), filed Aug. 16, 1991, entitled SIDEWALL ACTUATOR FOR A HIGH DENSITY INK JET PRINTHEAD, and U.S. patent application Ser. No. 746,036 to Pies et al (Atty. Docket No. 09447/0043, P-256), filed Aug. 16, 1991, entitled METHOD OF MANUFACTURING A HIGH DENSITY INK JET PRINTHEAD ARRAY.

TECHNICAL FIELD OF THE INVENTION

This invention relates in general to printing devices and, more particularly, to a elongated ink jet printhead using joined piezoelectric material having a high density parallel channel array and sidewall actuators for injecting ink from the channels.

BACKGROUND OF THE INVENTION

Ink jet technology is increasingly being used for computer printers. Ink jet printing systems use the ejection of tiny droplets of ink to produce an image. The devices produce highly reproducible and controllable droplets, so that a droplet may be printed at a location specified by digitally stored image data. Most ink jet printing systems fall into one of two classifications. A "continuous jet" type ink jet printing system continuously ejects droplets from the printhead and directs the droplets either toward the paper or into a reservoir for recycling purposes. Continuous jet systems are based upon the phenomenon of uniform droplet formation from a stream of liquid issuing from an orifice. It has been previously observed that fluid ejected under pressure from an orifice about 50 to 80 microns in diameter tends to break up into uniform droplets upon the amplification of capillary waves induced onto the jet, for example, by an electromechanical device that causes pressure oscillations to propagate through the fluid. One drawback to continuous jet systems is that the fluid must be jetting even when little or no printing is required. This requirement degrades the ink and decreases reliability of the printing system.

A "drop-on-demand" type ink jet printing system ejects droplets from the printhead in response to a specific command related to the image to be produced. Typically, the ejection of a droplet is caused by an electromechanically induced pressure wave. In this type of system, a volumetric change in the fluid is induced by the application of voltage pulse to a piezoelectric material which is directly or indirectly coupled to the fluid. This volumetric change causes pressure/velocity transients to occur in the fluid and these are directed so as to produce a droplet that issues from an orifice. Since the voltage is applied only when a droplet is desired, these types of ink jet printing systems are referred to as drop-on-demand.

The use of piezoelectric materials in ink jet printers is well known. Most commonly, piezoelectric material is used in a piezoelectric transducer by which electric energy is converted into mechanical energy by applying an electric field across the material, thereby causing the piezoelectric material to deform. This ability to distort piezoelectric material has often been utilized in order to force the ejection of ink from the ink-carrying channels of ink jet printers. One such ink jet printer configuration which utilizes the distortion of a piezoelectric material to eject ink includes a tubular piezoelectric transducer which surrounds an ink-carrying channel. When the transducer is excited by the application of an electrical voltage pulse, the ink-carrying channel is compressed and a drop of ink is ejected from the channel. For example, an ink jet printer which utilizes circular transducers may be seen by reference to U.S. Pat. No. 3,857,045 to Zoltan. However, the relatively complicated arrangement of the piezoelectric transducer and the associated ink-carrying channel causes such devices to be relatively time-consuming and expensive to manufacture.

In order to reduce the per ink-carrying channel (or "jet") manufacturing cost of an ink jet printhead, in particular, those ink jet printheads having a piezoelectric actuator, it has long been desired to produce an ink jet printhead having a channel array in which the individual channels which comprise the array are arranged such that the spacing between adjacent channels is relatively small. For example, it would be very desirable to construct an ink jet printhead having a channel array where adjacent channels are spaced between approximately three and six jet printhead is hereby defined as a "high density" ink jet printhead. In addition to a reduction in the per ink-carrying channel manufacturing cost, another advantage which would result from the manufacture of an ink jet printhead with a high channel density would be an increase in printer speed.
However, the very close spacing between channels in the proposed high density ink jet printhead has long been a major problem in the manufacture of such printheads.

Many attempts to manufacture ink jet printheads having piezoelectric actuators and reduced spacing between channels have focussed on the manufacture of ink jet printheads with parallel channel arrays and shear mode piezoelectric transducers for actuating the channels. For example, U.S. Pat. Nos. 4,584,590 and 4,825,227, both to Fischbeck et al., disclose shear mode piezoelectric transducers for a parallel channel array ink jet printhead. In both of the Fischbeck et al. patents, a series of open ended parallel ink pressure chambers are covered with a sheet of a piezoelectric material along their roofs. Electrodes are provided on opposite sides of the sheet of piezoelectric material such that positive electrodes are positioned above the vertical walls separating pressure chambers and negative electrodes are positioned over the chamber itself. When an electric field is provided across the electrodes, the piezoelectric material, which is polled in a direction normal to the electric field direction, distorts in a shear mode configuration to compress the ink pressure chamber. In these configurations, however, much of the piezoelectric material is inactive. Furthermore, the extent of deformation of the piezoelectric interest is small.

An ink jet printhead having a parallel channel array and which utilizes piezoelectric materials to construct the sidewalls of the ink-carrying channels may be seen by reference to U.S. Pat. No. 4,536,097 to Nilsson. In Nilsson, an ink jet channel matrix is formed by a series of strips of a piezoelectric material disposed in spaced parallel relationships and covered on opposite sides by first and second plates. One plate is constructed of a conductive material and forms a shared electrode for all of the strips of piezoelectric material. On the other side of the strips, electrical contacts are used to electrically connect channel defining pairs of the strips of piezoelectric material. When a voltage is applied to the two strips of piezoelectric material which define a channel, the strips become narrower and higher such that the enclosed cross-sectional area of the channel is enlarged and ink is drawn into the channel. When the voltage is removed, the strips return to their original shape, thereby reducing channel volume and ejecting ink therefrom.

An ink jet printhead having a parallel ink-carrying channel array and which utilizes piezoelectric material to form a shear mode actuator for the vertical walls of the channel has also been disclosed. For example, U.S. Pat. Nos. 4,879,568 to Bartky et al. and 4,887,100 to Michaelis et al. each disclose an ink jet printhead channel array in which a piezoelectric material is used as the vertical wall along the entire length of each channel forming the array. In these configurations, the vertical channel walls are constructed of two oppositely polled pieces of piezoelectric material mounted next to each other and sandwiched between top and bottom walls to form the ink channels. Once the ink channels are formed, electrodes are then deposited along the entire height of the vertical channel wall. When an electric field normal to the polling direction of the pieces of piezoelectric material is generated between the electrodes, the vertical channel wall distorts to compress the ink jet channel in a shear mode fashion.

The manufacture of ink jet printheads having parallel channel arrays with sidewall actuators such as those disclosed by Bartky et al. and Michaelis et al. would be quite cumbersome in practice. To form such an ink jet printhead, a base wall would first be provided and a layer of piezoelectric material mounted thereon. A multiplicity of parallel grooves which extend through the piezoelectric material would then be formed, thereby providing the sidewalls which define the channels of the array. Electrodes would then be mounted on the surfaces of the sidewalls which define the channels so that the electric field required to displace the sidewalls may be applied. Electrical drive circuit means would then be connected and a top wall secured to the piezoelectric sidewalls to close the channels. In particular, mounting electrodes on the surfaces of the sidewalls which define the channels can prove quite difficult in practice, particularly in view of the very small dimensions typically involved. One method to mount electrodes along the surfaces of the sidewalls defining the channels would be to metallize the piezoelectric material along the surfaces, remove the metal from the tops of the walls forming the deep grooves and then making electrical connections to the walls deep within the grooves. It is anticipated that each of these steps would pose significant manufacturing problems.

One problem with manufacture of ink jet printheads using polarized piezoelectric material is the magnitude of the electric field necessary for polarization. Generally, at least 500 volts per mil is necessary for polarization. Consequently, for a long printhead, such as a page width printhead which must be at least 11 inches in length, an extremely high electric field would be necessary.

It would be most desirable to have a printhead which is as long as the widest paper size supported (i.e., a "page width" printhead). A page width printhead has several advantages. First, movement of the printhead may be eliminated or greatly reduced, thereby increasing the reliability of the system. Second, the speed of printing is significantly increased. Third, because the range of movement is limited or eliminated, the resultant image is of much greater quality.

Therefore, a need has arisen for a wide printhead using a high density parallel channel array in a polarized piezoelectric material.

SUMMARY OF THE INVENTION

In accordance with the present invention, an elongated printhead and method of forming the same is provided which eliminates problems associated with prior ink jet devices.

The printhead of the present invention uses a plurality of sheets of polarized piezoelectric material, said sheets having channels formed therein to receive ink. A joining material is disposed between the sheets to form an elongated sheet of polarized piezoelectric material. Control circuitry is coupled to the sheets to actuate selected of said channels to eject ink. The joining material may be either a conductive or a nonconductive glue, depending upon the configuration.

In the preferred embodiment, the sheets of polarized piezoelectric material are joined at opposite parallel side edges which form an acute angle with the channels formed therein, such that the joints are spread out across a plurality of channels, thereby reducing the effect of a joint on one channel relative to channels without joints.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–19 of the drawings, like numerals being used for like and corresponding parts of the various drawings.

Figure 1:
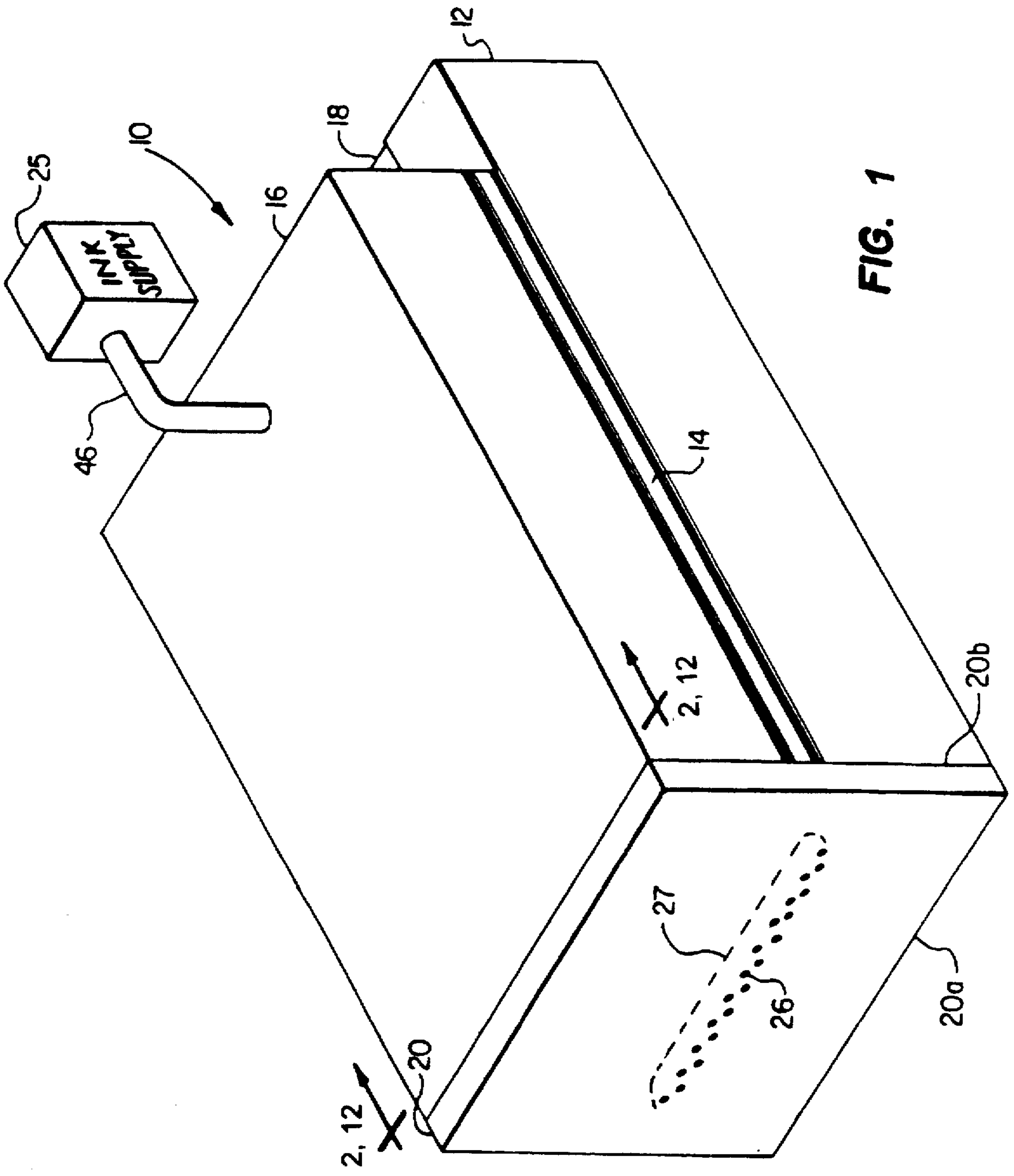
FIG. 1 is a perspective view of a schematically illustrated ink jet printhead.

Referring now to the drawing wherein thicknesses and other dimensions have been exaggerated in the various figures as deemed necessary for explanatory purposes and wherein like reference numerals designate the same or similar elements throughout the several views, in FIG. 1, an ink jet printhead 10 constructed in accordance with the teachings of the present invention may now be seen. The ink jet printhead 10 includes a main body portion 12 which is aligned, mated and bonded to an intermediate body portion 14, which, in turn, is aligned, mated and bonded to a top body portion 16. As will be better seen in FIG. 4*a*, in the embodiment of the invention illustrated herein, the main body portion 12 continues to extend rearwardly past the intermediate body portion 14 and the top body portion 16, thereby providing a surface on the ink jet printhead 10 on which a controller (not visible in FIG. 1) for the ink jet printhead 10 may be mounted. It is fully contemplated, however, that the main body portion 12, the intermediate body portion 14 and the top body portion 16 may all be of the same length, thereby requiring that the controller be remotely positioned with respect to the ink jet printhead 10.

A plurality of vertical grooves of predetermined width and depth are formed through the intermediate body portion 14 and the main body portion 12 to form a plurality of pressure chambers or channels 18 (not visible in FIG. 1), thereby providing a channel array for the ink jet printhead 10. A manifold 22 (also not visible in FIG. 1) in communication with the channels 18 is formed near the rear portion of the ink jet printhead 10. Preferably, the manifold 22 is comprised of a channel extending through the intermediate body portion 14 and the top body portion 16 in a direction generally perpendicular to the channels 18. As to be more fully described below, the manifold 22 communicates with an external ink conduit 46 to provide means for supplying ink to the channels 18 from a source of ink 25 connected to the external ink conduit 46.

Continuing to refer to FIG. 1, the ink jet printhead 10 further includes a front wall 20 having a front side 20*a*, a back side 20*b* and a plurality of tapered orifices 26 extending therethrough. The back side 20*b* of the front wall is aligned, mated and bonded with the main, intermediate and top body portions 12, 14, and 16, respectively, such that each orifice 26 is in communication with a corresponding one of the plurality of channels 18 formed in the intermediate body portion 14, thereby providing ink ejection nozzles for the channels 18. Preferably, each orifice 26 should be positioned such that it is located at the center of the end of the corresponding channel 18, thereby providing ink ejection nozzles for the channels 18. It is contemplated, however, that the ends of each of the channels 18 could function as orifices for the ejection of drops of ink in the printing process without the necessity of providing the front wall 20 and the orifice 26. It is further contemplated that the dimensions of the orifice array 27 comprised of the orifices 26 could be varied to cover various selected lengths along the front wall 20 depending on the channel requirements of the particular ink jet printhead 10 envisioned. For example, in one configuration, it is contemplated that the centers of adjacent orifices 26 would be approximately 0.0068 inches apart.

Figure 2:
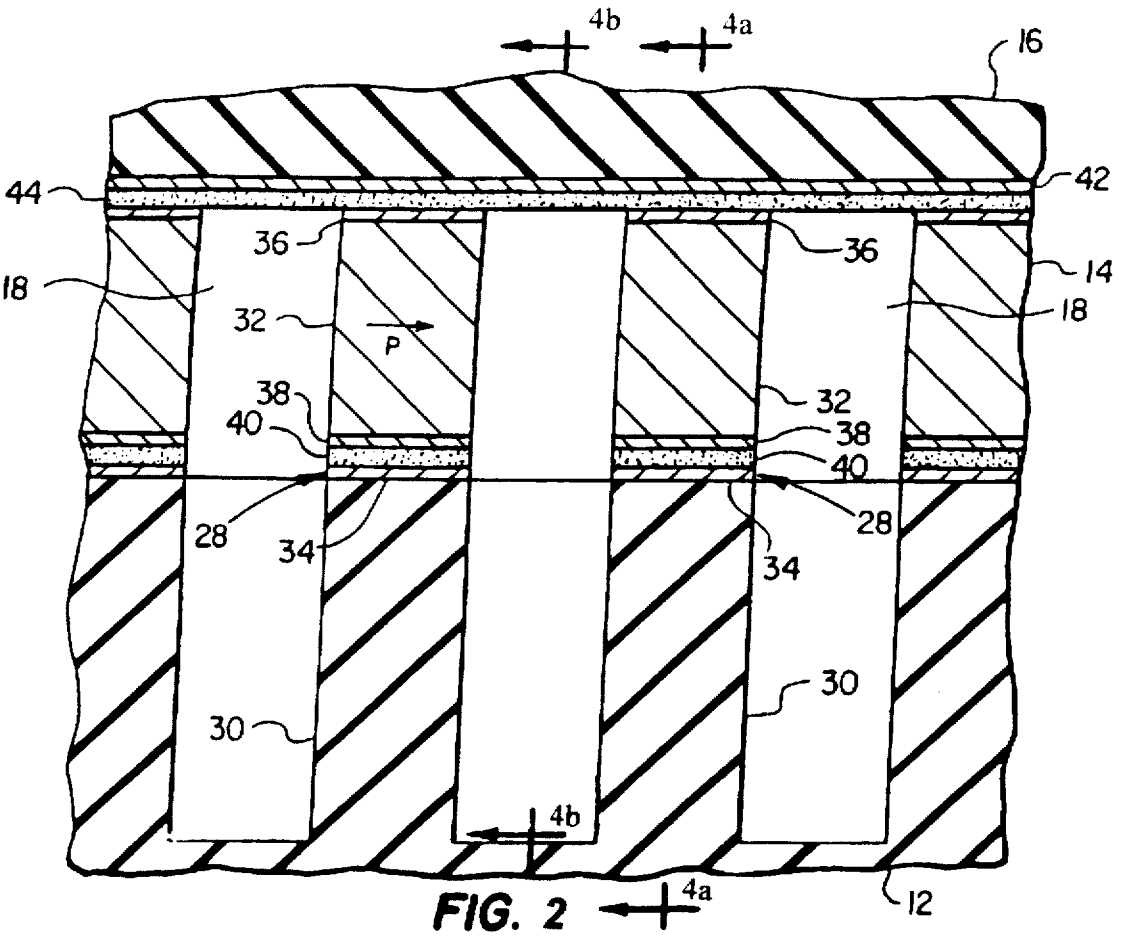
FIG. 2 is an enlarged partial cross-sectional view of the ink jet printhead of FIG. 1 taken along lines 2—2 and illustrating a parallel channel array of the ink jet printhead of FIG. 1.

Referring next to FIG. 2, an enlarged partial cross-sectional view of the ink jet printhead 10 taken along lines 1—1 of FIG. 1 may now be seen. As may now be clearly seen, the ink jet printhead 10 includes a plurality of parallel spaced channels 18, each channel 18 vertically extending from the top body portion 16, along the intermediate body portion 14 and part of the main body portion 12 and extending lengthwise through the ink jet printhead 10. The main body portion 12 and the top body portion 16 are constructed of a inactive material, for example, unpolarized piezoelectric material. Separating adjacent channels 18 are sidewall actuators 28, each of which include a first sidewall section 30 and a second sidewall section 32. The first sidewall section 30 is constructed of an inactive material, for example, unpolarized piezoelectric material, and, in the preferred embodiment of the invention, is integrally formed with the body portion 12. The second sidewall section 32, is formed of a piezoelectric material, for example, lead zirconate titante (or "PZT"), polarized in direction "P" perpendicular to the channels 18.

Mounted to the top side of each first sidewall section 30 is a metallized conductive surface 34, for example, a strip of metal. Similarly, metallized conductive surfaces 36 and 38, also formed of a strip of metal, are mounted to the top and bottom sides, respectively, of each second sidewall section 32. A first layer of a conductive adhesive 40, for example, an epoxy material filled with silver or gold, is provided to conductively attach the metallized conductive surface 34 mounted to the first sidewall section 30 and the metallized conductive surface 38 mounted to the second sidewall section 32. Finally, the bottom side of the top body portion 16 is provided with a metallized conductive surface 42 which, in turn, is conductively mounted to the metallized conductive surfaces 36 of the second sidewall section 32 by a second layer of a conductive adhesive 44. In this manner, a series of channels 18, each channel being defined by the unpolarized piezoelectric material of the main body portion 12 along its bottom, the layer of conductive adhesive 44 along its top and a pair of sidewall actuators 28 have been provided. Each sidewall actuator 28 is shared between adjacent channels 18. The first sidewall section 30 may be formed having any number of various heights relative to the second sidewall section 32. It has been discovered, however, that a ratio of 1.3 to 1 between the first sidewall section 30 constructed of unpolled piezoelectric material and the second sidewall section 32 formed of polarized piezoelectric material has proven quite satisfactory in use. Furthermore, while the embodiment of the invention illustrated in FIG. 2 includes the use of metallized conductive surfaces 34, 36, 38 and 42, it has been discovered that the use of such surfaces may be omitted without adversely affecting the practice of the invention. The method of manufacturing the high density ink jet printhead illustrated herein is more fully described in U.S. patent application Ser. No. 746,036, (Atty. Docket No. 09447/0043) previously incorporated by reference.

Figure 3:
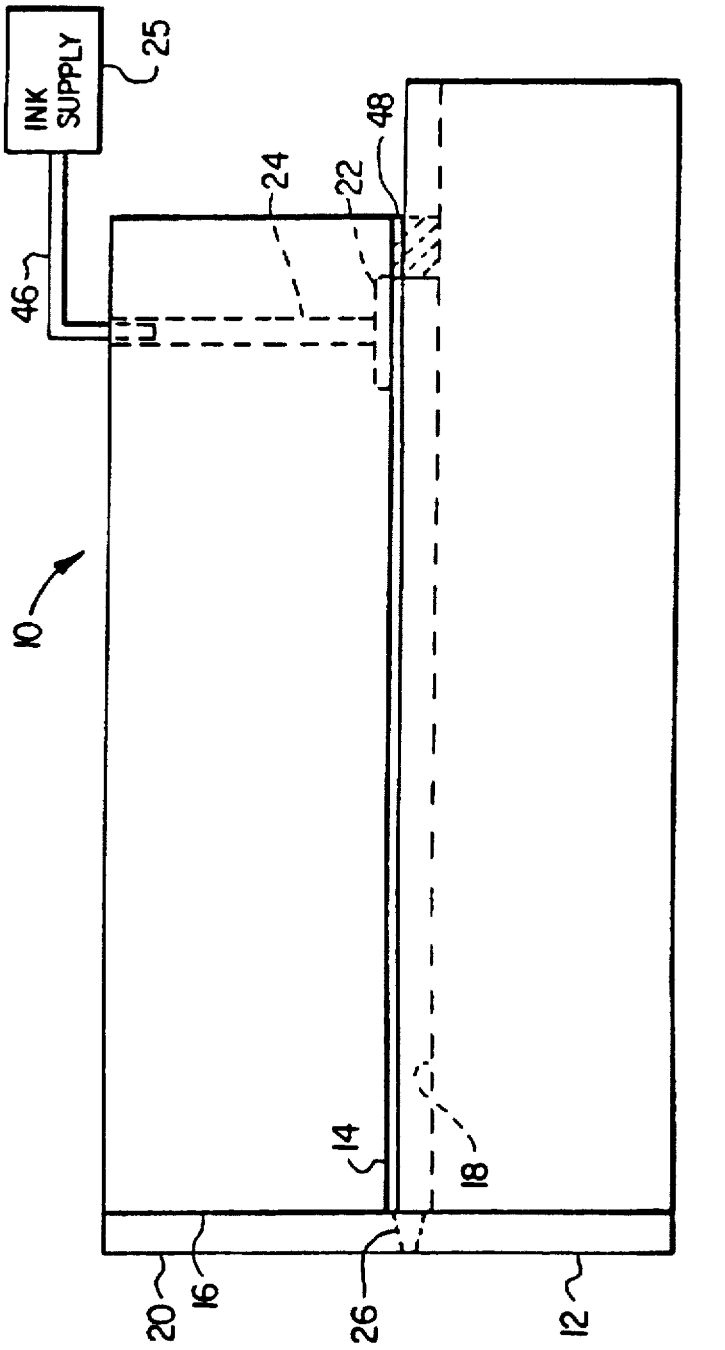
FIG. 3 is a side elevational view of the ink jet printhead of FIG. 1.

Referring next to FIG. 3, a side elevational view of the high density ink jet printhead 10 which better illustrates the means for supplying ink to the channels 18 from a source of ink 25 may now be seen. Ink stored in the ink supply 25 is supplied via the external ink conduit 46 to an internal ink conduit 24 which extends vertically through the top body portion 16. The internal ink conduit 24 may be positioned anywhere in the top body portion 16 of the ink jet printhead 10 although, in the preferred embodiment of the invention, the internal ink conduit 24 extends through the general center of the top body portion 16. Ink supplied through the internal ink conduit 24 is transmitted to a manifold 22 extending generally perpendicular to and in communication with each of the channels 18. While the channels 18 extend across the entire length of the ink jet printhead 10, a block 48 of a composite material blocks the back end of the channels 18 so that ink supplied to the channels 18 shall, upon actuation of the channel 18, be propagated in the forward direction where it exits the ink jet printhead 10 through the corresponding one of the tapered orifices 26.

Figure 4A:
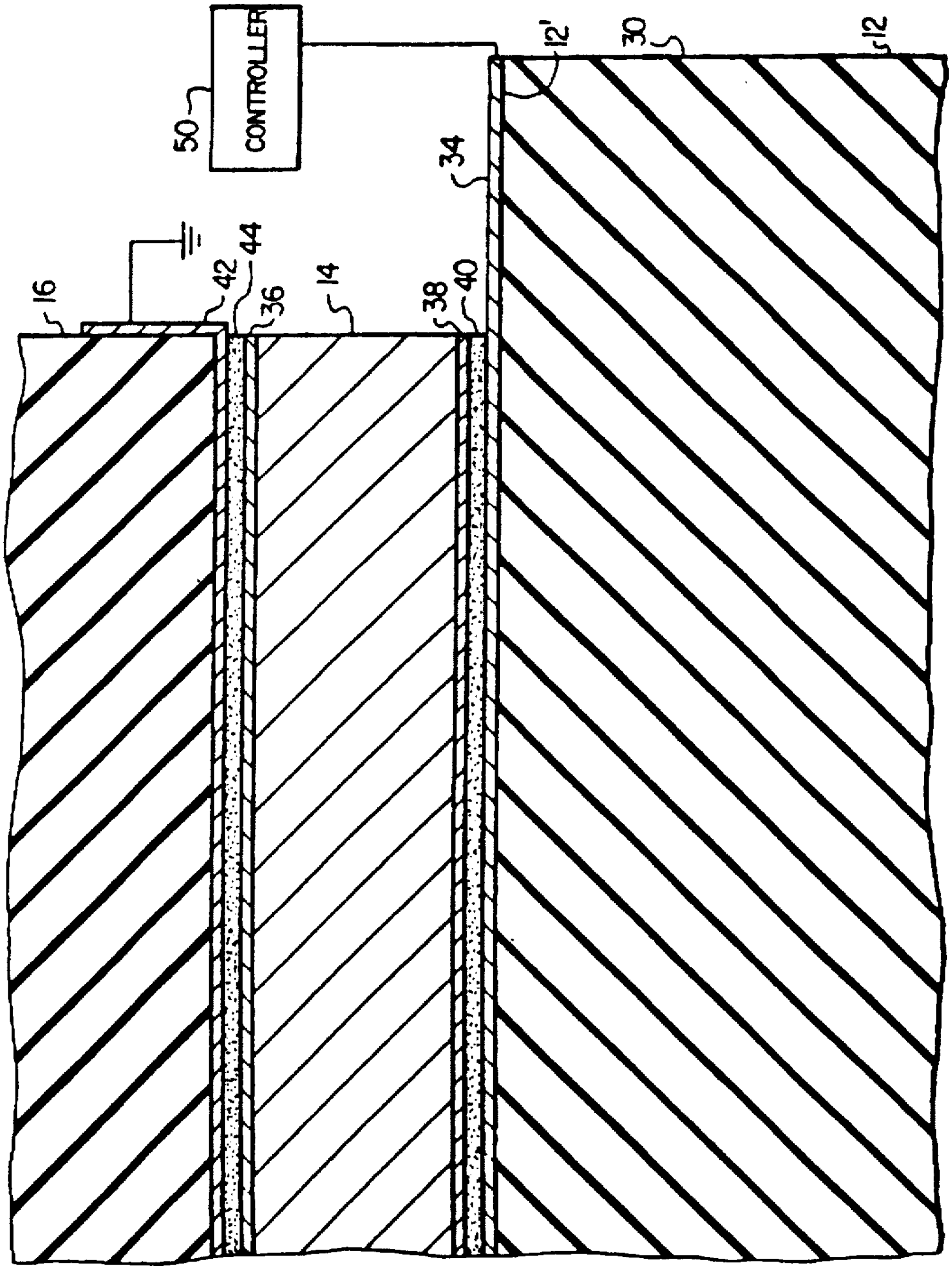
FIG. 4*a* is an enlarged partial cross-sectional view of a rear portion of the ink jet printhead of FIG. 2 taken along lines 4*a*—4*a*.

Referring next to FIG. 4a, a cross-sectional view of a rear portion of the ink jet printhead 10 taken along lines 4a—4a of FIG. 2 which illustrates a sidewall of the channel 18 may now be seen. Also visible here is the electrical connection of the ink jet printhead 10. A controller 50, for example, a microprocessor or other integrated circuit, is electrically connected to the metallized conductive surface 34 which separates the first and second sidewall actuator sections 30, 32. It should be further noted that while, in the embodiment illustrated in FIG. 4a, a remotely located controller is disclosed, it is contemplated that the controller may be mounted on the rearwardly extending portion 12' of the main body portion 12. Each metallized conductive surface 42 which separates the second sidewall section 32 and the top body portion 16, on the other hand, is connected to ground. While FIG. 4a illustrates the electrical connection of a single conductive strip 34 to the controller 50 and the single conductive strip 42 to ground, it should be clearly understood that each sidewall actuator 30 has a similarly constructed conductive strip 34 extending outwardly at the rear portion of the ink jet printhead 10 for connection to the controller 50 and a similarly constructed conductive strip 42 connected to ground. As to be more fully described below, the controller 50 operates the ink jet printhead 10 by transmitting a series of positive and/or negative charges to selected ones the conductive strips 34. As the top body portion 16 and main body portion 12 are non-conductive and layer of adhesive material 40, conductive metallized surface 38, intermediate body portion 14, conductive metallized surface 36, layer of adhesive material 44 and conductive metallized surface 42 are all conductive, a voltage drop across the intermediate body portions 14 corresponding to the selected metallized conductive surfaces 34 will be produced. This will cause the sidewalls which includes the intermediate body portion 14 across which a voltage drop has been placed to deform in a certain direction. Thus, by selectively placing selected voltages on the various sidewall actuators, the channels 18 may be selectively "fired", i.e., caused to eject ink, in a given pattern, thereby producing a desired image.

The exact configuration of a pulse sequence for selectively firing the channels 18 may be varied without departing from the teachings of the present invention. For example, a suitable pulse sequence may be seen by reference to the article to Wallace, David B., entitled "A Method of Characteristic Model of a Drop-on-Demand Ink-Jet Device Using an Integral Method Drop Formation Model", 89-WA/FE-4 (1989). In its most general sense, the pulse sequence for a sidewall actuator 28 consists of a positive (or "+") segment which imparts a pressure pulse into the channel 18 being fired by that sidewall actuator 28 and a negative (or "-") segment which imparts a complementary, additive pressure pulse into the channel 18 adjacent to the channel 18 being fired which shares the common sidewall 28 being actuated. For example, in one embodiment of the invention, each sidewall actuator 28 of the pair of adjacent sidewall actuators 28 which define a channel 18 has a pulse sequence which includes the aforementioned positive and negative voltage segments, but for which the positive and negative voltage segments are applied during opposing time intervals for respective ones of the pair, thereby forming a +, −, +, − voltage pattern which would cause every other channel 18 to eject a droplet of ink after the application of voltage. In a second embodiment of the invention, a first pair of adjacent sidewall actuators 28 which define a first channel may have a pulse sequence which includes the aforementioned positive and negative voltage segments applied during opposing time intervals for respective ones of the first pair, and a second pair of adjacent sidewall actuators 28 which define a second channel adjacent to the first channel may have no voltage applied thereto during these time intervals, thereby forming a +, −, 0, 0 voltage pattern in which every fourth channel 18 would fire after the application of voltage. As may be further seen, multiple patterns of channel actuations too numerous to mention may be provided by the selective application of voltages to the first layer of conductive adhesive 40 corresponding to each sidewall actuator 28.

Figure 4B:
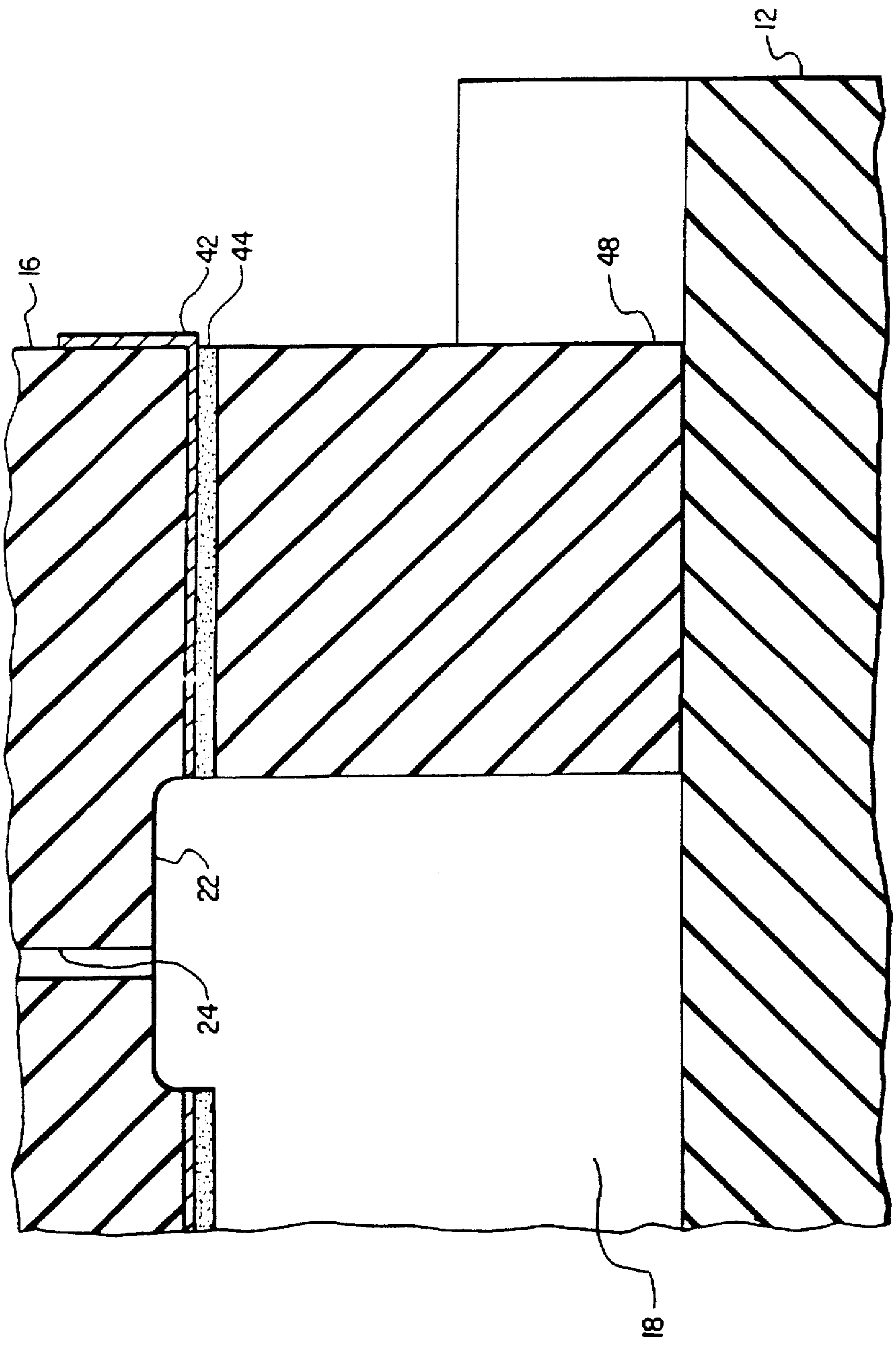
FIG. 4*b* is an enlarged partial cross-sectional view of a rear portion of the ink jet printhead of FIG. 2 taken along lines 4*b*—4*b*.

Referring next to FIG. 4b, a cross-sectional view of the rear portion of the ink jet printhead 10 taken along lines 4b—4b which better illustrates the ink supply path to the channel 18 via the internal ink conduit and the manifold 22. Also more clearly visible in FIG. 4b is the block 48, typically formed of an insulative composite material, which blocks the back end of the channel 18 so that ink supplied to the channel 18 will be propagated forward upon the activation of a pressure pulse in a manner more fully described elsewhere.

Figure 5:
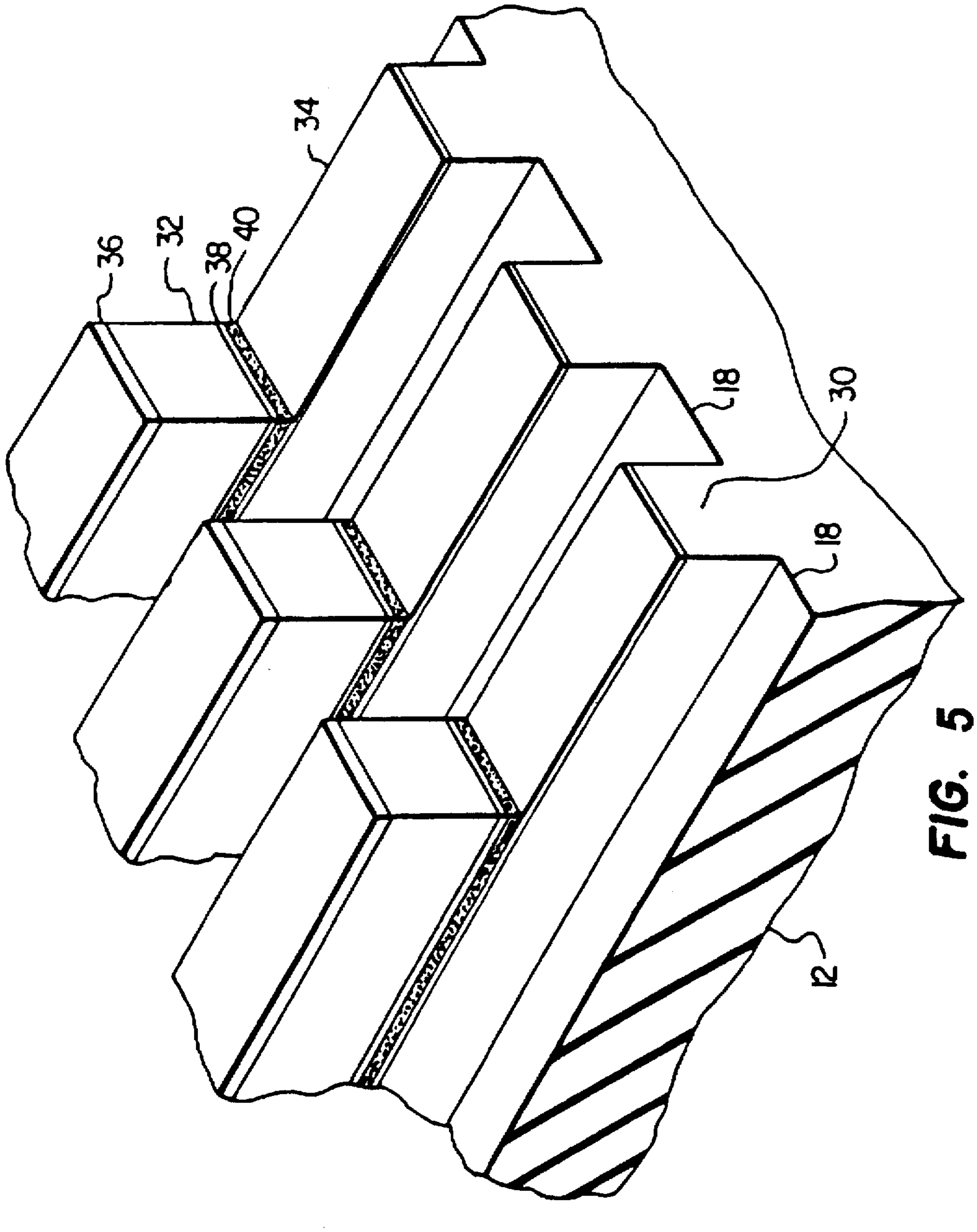
FIG. 5 is an enlarged partial perspective view of the rear portion of the ink jet printhead of FIG. 1 with top body portion removed.

Referring next to FIG. 5, the rear portion of the ink jet printhead with the top body portion 16 and the block of composite material 48 removed is now illustrated to more clearly show the details of the structure of the high density ink jet printhead 10. As may be seen herein, in the forming of channels 18, preferably by sawing the main body portion 12 and attached intermediate body portion 14 in predetermined locations, portions of the metallized conductive surfaces 34 are removed, thereby permitting the metallized conductive surfaces 34 to function as individual electrical contact for each sidewall 30 and portions of metallized conductive surfaces 36 are permitted to function as individual ground connections for each sidewall 30.

Figure 6A:
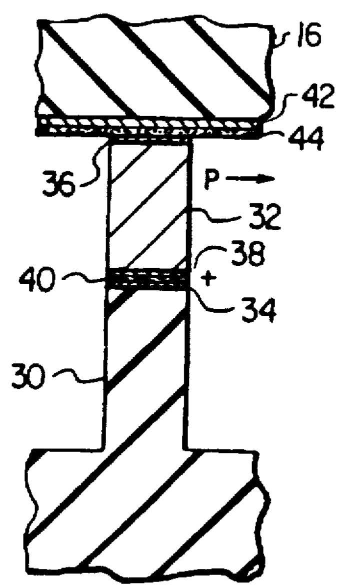
FIG. 6*a* is a front elevational view of a single, undeflected, actuator sidewall of the ink jet printhead of FIG. 1.

Referring next to FIG. 6*a*, a single actuator wall of the ink jet printhead 10 may now be seen. The sidewall actuator 28 is comprised of a first actuator sidewall section 30 and a second actuator sidewall section 32, both of which extend along the entire length of an adjacent channel 18. The first sidewall section 30 is formed of unpolarized piezoelectric material integrally formed with the main body portion 12 of the ink jet printhead 10. The second sidewall section 32 is formed of a piezoelectric material poled in a direction perpendicular to the adjacent channel 18 and is conductively mounted to the top body portion 16 of the high-density ink jet printhead 10 which, as previously set forth, is also formed of an unpolarized piezoelectric material. The first and second actuator sidewall sections 30, 32 are conductively mounted to each other. For example, the first and second sidewall sections 30, 32 may be provided with a layer of conductive material 34, 38, respectively, bonded together by a layer of a conductive adhesive 40. Finally, the top side of the second actuator sidewall 32 is conductively mounted to the top body portion 16, by conductively mounting the 30 metallized conductive surfaces 36, 42.

Figure 6B:
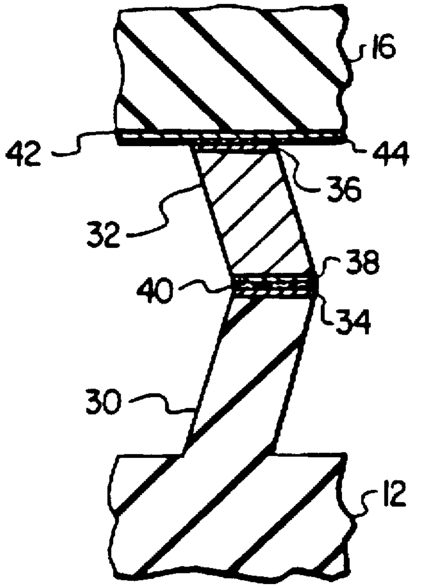
FIG. 6*b* is a front elevational view of the single actuator sidewall of FIG. 6*a* after deflection.

Referring next to FIG. 6*b*, the deformation of the actuator wall illustrated in FIG. 6*a* when an electric field is applied between the metallized conductive surface 34 and 42, shall now be described in detail. When a selected voltage is supplied to the metallized conductive surface 34, an electric field normal to the direction of polarization is produced. The second sidewall section 32 will then attempt to undergo shear deformation. However, as the metallized conductive surface 36 of the second sidewall section 32 is restrained, the metallized conductive surface 38 will move in a shear motion while the metallized conductive surface 36 remains fixed. The first sidewall section 30, being formed of an inactive material, is unaffected by the electric field. However, since the first sidewall section 30 is mounted to the second sidewall section 32 undergoing shear deformation, the first sidewall section 30 will be pulled by the second sidewall section 32, thereby forcing the first sidewall section 30 to bend in what is hereby defined as a "shear-like motion". This motion by the sidewall 28 produces a pressure pulse which increases the pressure in one of the adjacent channels 18 partially defined thereby to cause the ejection of a droplet of ink from that channel 18 shortly thereafter and a reinforcing pressure pulse in the other one of the adjacent channels 18.

Figure 7A:
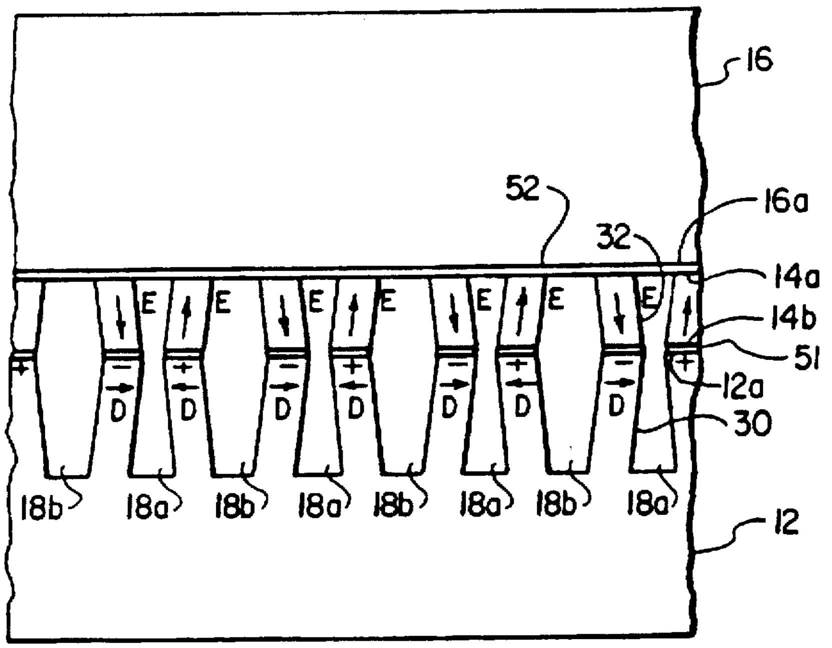
FIG. 7*a* is a front view of an alternate embodiment of the schematically illustrated ink jet printhead of FIG. 1 with front wall removed and after deflection of the actuator sidewalls of the parallel channel array.

Referring next to FIG. 7*a*, the typical operation of an alternate embodiment of the channel array of the high density ink jet printhead 10 subject of the present application will now be described. In this embodiment of the invention, the metallized conductive surfaces 34 and 38 and the layer of conductive adhesive 40 have been replaced by a single layer of conductive adhesive 51.

Similarly, the metallized conductive surfaces 36 and 42 and the layer of conductive adhesive 44 have been replaced by a single layer of conductive adhesive 52.

However, in order to eliminate the aforementioned metallized conductive surfaces while maintaining satisfactory operation of the high density ink jet printhead 10, a surface 14*b* of the intermediate body portion 14 and a surface 12*a* of the main body portion 12 must be conductively mounted together in a manner such that a voltage may be readily applied to the single layer of conductive adhesive 51 and a surface 14*a* of the intermediate body portion 14 and a surface 16*a* of the top body portion 16 must be conductively mounted together in a manner such that the single layer of conductive adhesive 52 therebetween may be readily connected to ground.

To activate the ink jet printhead 10, the controller 51 (not shown in FIG. 7*a*) responds to an input image signal representative of the image desired to be printed and applies voltages of predetermined magnitude and polarity to selected layers of conductive adhesive 51 which correspond to certain ones of the actuator sidewalls 28 on each side of the channels 18 to be activated. For example, if a positive voltage is applied to a layer of conductive adhesive 51, then an electric field E perpendicular to the direction of polarization is established in the direction from the layer of conductive adhesive 51 towards the layer of conductive adhesive 52 and the second sidewall section 32 will distort in a shear motion in a first direction normal to the channel 18 while carrying the first sidewall section 30, thereby cause the sidewall to undergo a shear-like distortion. On the other hand, by applying a negative voltage at the contact 34, the direction of the electric field E is reversed and the second sidewall section 32 will deflect in a shear motion in a second direction, opposite to the first direction, and normal to the channel 18. Thus, by placing equal charges of opposite polarity on adjacent sidewalls which define a channel 18 therebetween, a positive pressure wave is created in the channel 18 between the two adjacent sidewalls and a drop of ink is expelled, either through the open end 28 of the pressure chamber 18 or through the tapered orifice 26.

Figure 7C:
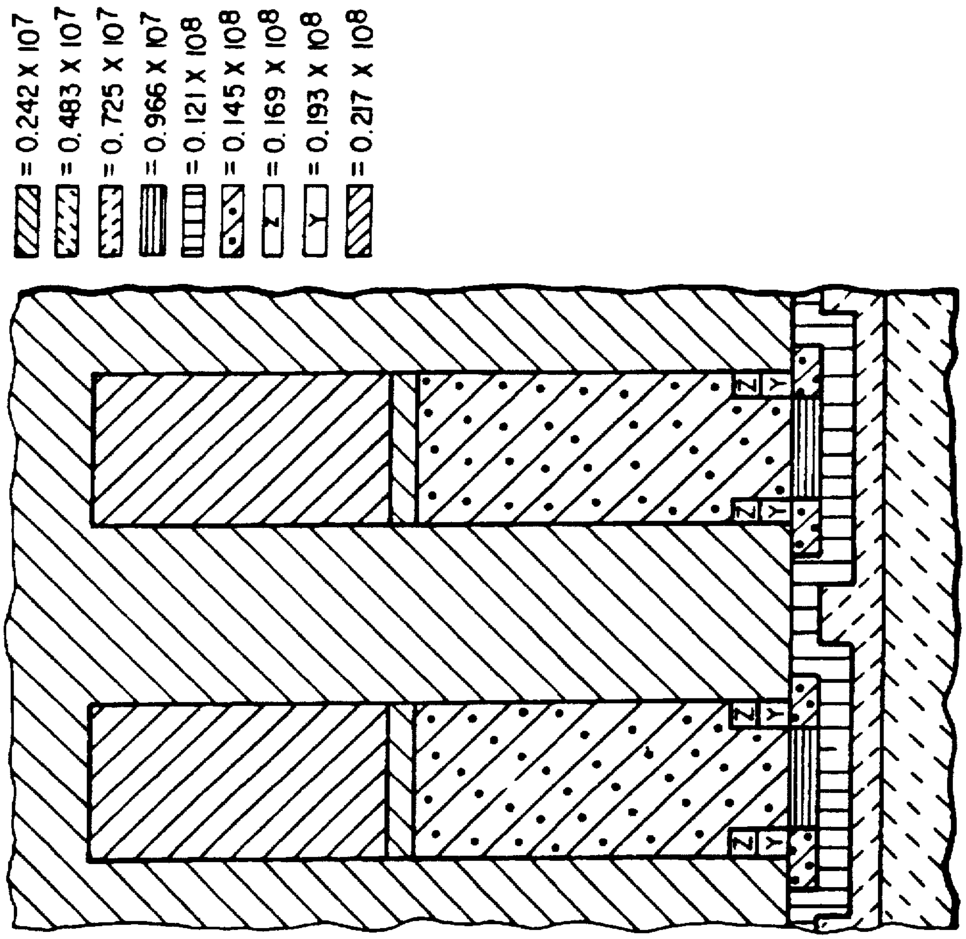
FIG. 7*c* is a graphically illustrated electrostatic field displacement analysis for the sidewall configuration of FIG. 7*b*.
Figure 7B:
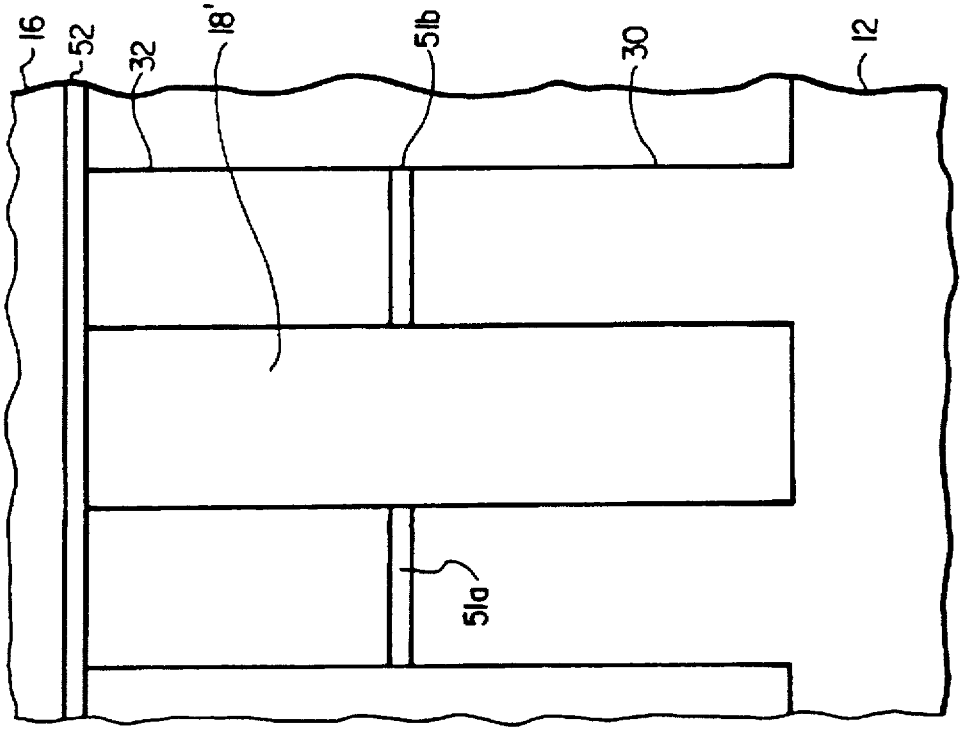
FIG. 7*b* is an enlarged partial front view of the schematically illustrated ink jet printhead of FIG. 7*a*.

Referring next to FIG. 7*b*, an enlarged view of a pair of sidewall actuators 28 and a single channel 18 of the channel array of FIG. 7*a* in an unactivated mode may now be seen. As the sidewall actuators 28 illustrated here are identical in construction to those described with respect to FIG. 7*a*, further description is not necessary. Prior to activation of the sidewall actuators 28, the channels 18 were filled with a nonconductive ink. The piezoelectric material used to form the sidewall actuators had a relative permittivity of 3300 and the nonconductive ink a relative permittivity of 1. Two separate tests were conducted using this embodiment of the invention, the first test having every fourth channel 18 activated by applying a voltage pattern of (plus, minus, zero, zero, . . . ) and the second test having every other channel 18 activated by applying a voltage pattern of (plus, minus, plus, minus . . . ). As no significant differences were produced between the two tests, only the results of the second test is described below. In this test, the layer of conductive material 52 was held at zero volts, the layer of conductive material 51*a* wa held at plus 1.0 volts, and the layer of conductive material 51*b* was held at minus 1.0 volts. Such a voltage configuration would cause the center channel 18' to compress.

Referring next to FIG. 7*c*, a graphical analysis of the electrostatic field generated during activation of the sidewall actuators 28 in accordance with the parameters of the second test may now be seen. As may be seen here, the displacement in the polarized piezoelectric material was of a magnitude such that tooth-to-tooth and jet-to-jet cross talk effects are negligible for nonconductive inks. One unexpected result was that the magnitude electric field in the unpolarized piezoelectric material was over sixty percent of that of the poled piezoelectric material. This phenomena occurred because the flow of charge is dominated by the high permittivity of the piezoelectric material. In addition, the direction of the field in the unpolarized piezoelectric material is such that, if this material were polarized, the displacement of the tooth would increase by greater than sixty percent due to the unpolarized section of the tooth being longer than the polarized section. Thus, if the longer, piezoelectric material piece were polarized, the displacement would be still greater.

Although not illustrated herein, similar tests were performed using a conductive inks. In such a test, the conductive ink would short the layers of conductive material 51, 52 unless the sidewall actuators 28 are insulated by a thin layer of conductive material along the surface of the sidewall actuators adjacent the channels filled with conductive ink. It is contemplated, therefore, that the interior of the channel be coated with a layer of dielectric material having a generally uniform thickness of between approximately 2 and 10 micrometers when the use of a conductive ink is contemplated. Apart from the requirement of a layer of dielectric material, the operation of the ink jet printhead 10 did not differ significantly when a conductive ink was utilized.

Figure 8A:
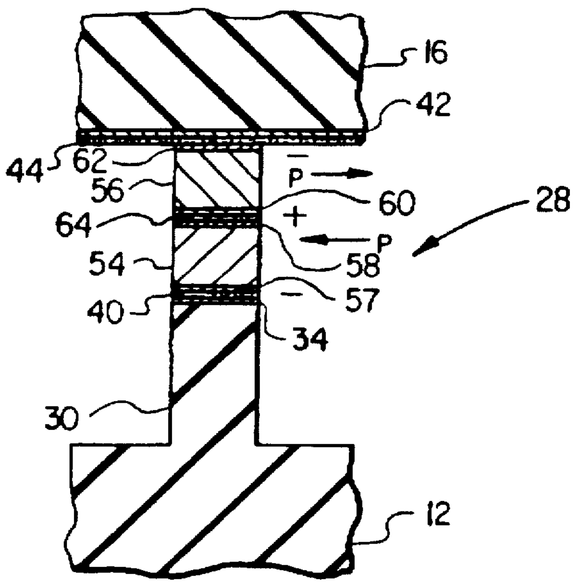
FIG. 8*a* is a front elevational view of a second embodiment of the undeflected actuator sidewall illustrated in FIG. 6*a*.

Referring next to FIG. 8*a*, a second embodiment of the sidewall actuator 28 may now be seen. This embodiment is comprised of a first sidewall section 30 formed of unpolarized piezoelectric material and integrally formed with and extending from the main body portion 12, a second sidewall section 54 formed of a piezoelectric material and a third sidewall section 56 also constructed of a piezoelectric material. The second and third sidewall sections 54, 56 should be bonded together such that the poling directions are rotated 180 degrees from each other. Each poled piezoelectric material sidewall section 54, 56 should have top and bottom metal layers of metallized material 57 and 58, 60 and 62, respectively. The first metallized conductive surface 57 of the second sidewall section 54 is mounted to the metallized conductive surface 34 of the first sidewall section 30 by the first layer of conductive adhesive 40 and the second metallized conductive surface 58 of the second sidewall section 54 is mounted to the first metallized conductive surface 60 of the third sidewall section 56 by a third layer of conductive adhesive 64. Finally, the second metallized conductive surface 62 of the third sidewall section 56 is mounted to the top body portion 16 by the second layer of conductive adhesive 44. Conductive surface 58 and conductive surface 38 should be interconnected and held at common potential, common i.e., ground. An electric field is created by applying a voltage to the conductive surface between the second and third sidewall sections 54, 56.

Figure 8B:
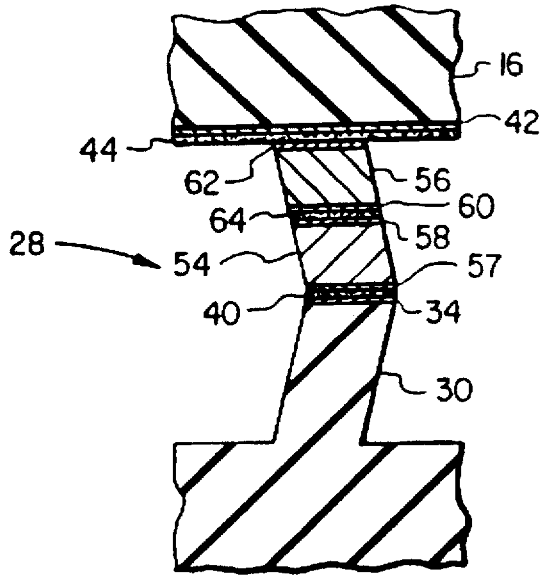
FIG. 8*b* is a front elevational view of the actuator sidewall of FIG. 8*a* after deflection.

As may be seen in FIG. 8*b*, the deformation of the sidewall actuator does not differ significantly from that previously described except that each section 54, 56 undergo individual shear deformations.

Figure 9A:
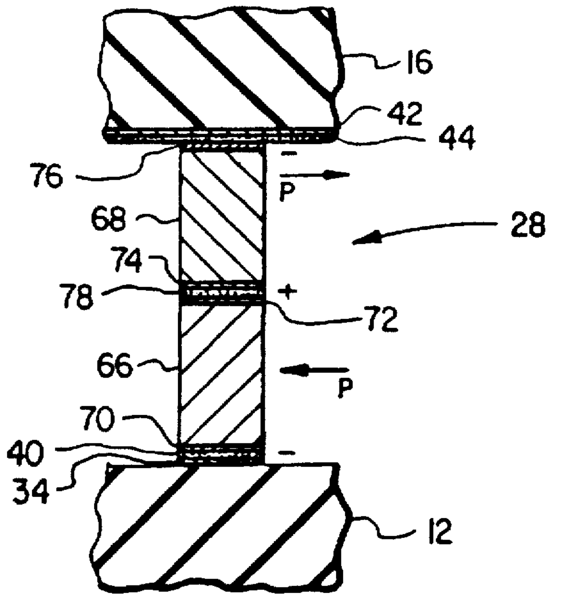
FIG. 9*a* is a front elevational view of a third embodiment of the undeflected actuator sidewall illustrated in FIG. 6*a*.

Referring next to FIG. 9*a*, the third embodiment of the sidewall actuator 28 shall now be described in greater detail. More specifically, in this embodiment, the first and second sidewall sections are both constructed of poled piezoelectric materials such that the direction of poling are aligned. An electric field is created by applying a voltage to the surface between the two poled piezoelectric material sections 30, 32.

Figure 9B:
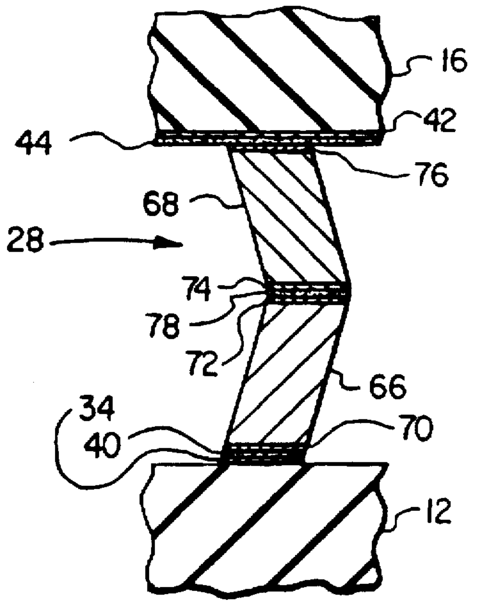
FIG. 9*b* is a front elevational view of the actuator wall of FIG. 9*a* after deflection.

The electric field vector for the top sidewall section 32 is 180° relative to that of the first sidewall section 30. Accordingly, the top and bottom sidewall sections shear in opposite directions. However, less than half the voltage should be needed to achieve the same displacement. Here, the sidewall actuator is again comprised of a pair of sidewall sections, but here, the first and second sidewall sections 66, 68, having first and second metallized conductive surfaces 70 and 72, 74 and 76, respectively, are both formed of an active material. Here, the first layer of conductive adhesive 40 conductively mounts the first metallized conductive surface 34 of the main body portion 12 to the first metallized conductive surface 70 of the first sidewall section 66, a fourth layer of conductive adhesive 78 conductively mounts the second metallized conductive surface 72 of the first sidewall section 66 and the first metallized conductive surface 74 of the second sidewall section 68, and the second layer of conductive adhesive 44 conductively mounts the second metallized conductive surface 76 of the second sidewall section 68 and the metallized conductive surface 42 of the top body portion 16. As illustrated in FIG. 9*b*, however, in this embodiment of the invention, both sidewall sections 68, 70 undergo individual shear deformations.

Figure 10A:
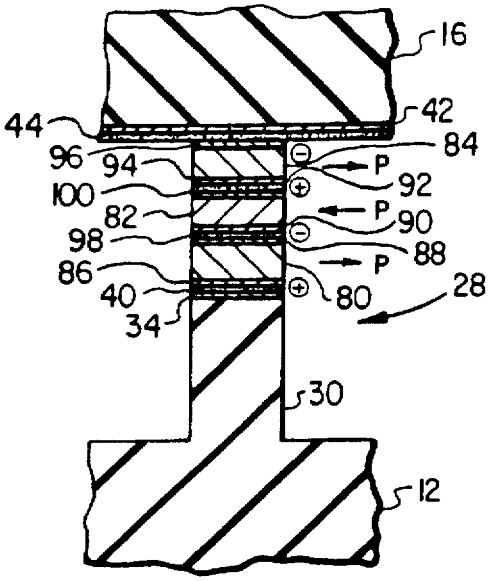
FIG. 10*a* is a front elevational view of a fourth embodiment of the undeflected actuator sidewall illustrated in FIG. 6*a;*
Figure 10B:
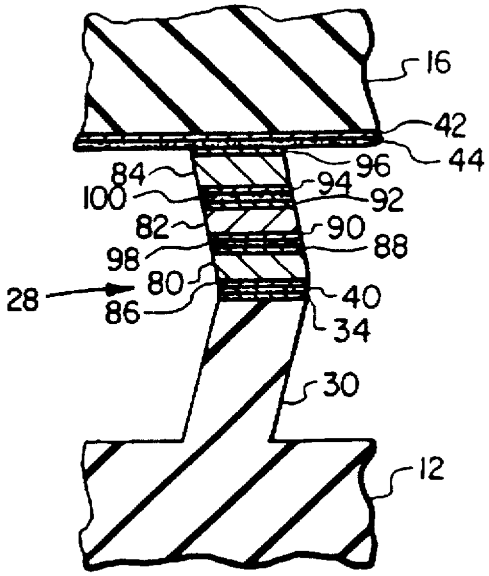
FIG. 10*b* is a front elevational view of the actuator wall of FIG. 10*a* after deflection.

Referring next to FIG. 10*a*, the fourth embodiment of the sidewall actuator 28 shall now be described in greater detail. Here, the sidewall actuator 28 is comprised of a first sidewall section 30 formed form an inactive material and second, third, and fourth sidewall sections 80, 82 and 84 formed from an active material.

Each active sidewall section 80, 82 and 84 has first and second metallized conductive surfaces 86 and 88, 90 and 92, and 94 and 96, respectively. In this embodiment, the first layer of conductive adhesive layer 40 conductively mounts the metallized conductive surfaces 34 and 86, a third conductive adhesive layer 98 conductively mounts metallized conductive surfaces 88 and 90, a fourth conductive adhesive layer 100 conductively mounts metallized conductive surfaces 92 and 94, and the second conductive adhesive layer 44 conductively mounts metallized conductive surfaces 96 and 42. As may be seen in FIG. 10*b*, the deformation is similar to that illustrated and described with respect to FIG. 6*b*.

Figure 11A:
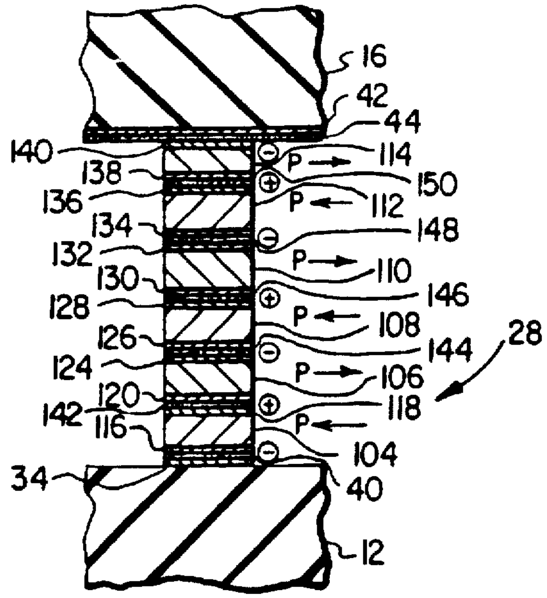
FIG. 11*a* is a front elevational view of a fifth embodiment of the undeflected actuator wall illustrated in FIG. 6*a;*
Figure 11B:
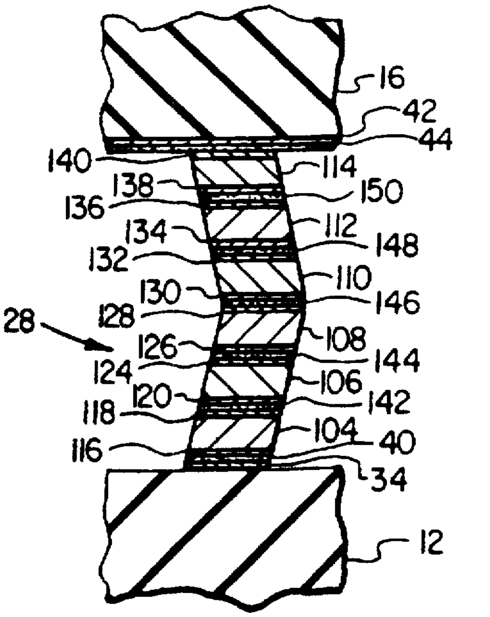
FIG. 11*b* is a front elevational view of the actuator wall of FIG. 11*a* after deflection.

Referring next to FIG. 11*a*, the fifth embodiment of the sidewall actuator 28 shall now be described in greater detail. Here, the sidewall actuator 28 is comprised of first, second, third, fourth, fifth, and sixth sidewall sections 104, 106, 108, 110, 112, and 114, each formed of an active material and each having first and second metallized conductive surfaces 116 and 118, 120 and 124, 126 and 128, 130 and 132, 134 and 136, 138 and 140, respectively attached thereto. The first conductive adhesive layer 40 conductively mounts metallized conductive surfaces 34 and 116, a third conductive adhesive layer 142 conductively mounts metallized conductive surfaces layers 118 and 120, a fourth conductive adhesive layer 144 conductively mounts metallized conductive surfaces 124 and 126, a fifth conductive adhesive layer 146 conductively mounts metallized conductive surfaces 128 and 130, a sixth conductive adhesive layer 148 conductively mounts metallized conductive surfaces 132 and 134, a seventh conductive adhesive layer 150 conductively mounts layers 136 and 138, and the second conductive adhesive layer 44 conductively mounts the metallized conductive surfaces 140 and 42. As may be seen in FIG. 11*b*, the deformation of the sidewall actuator 28 set forth in this embodiment of the invention is similar to that described and illustrated in FIG. 9*b*.

Figure 12:
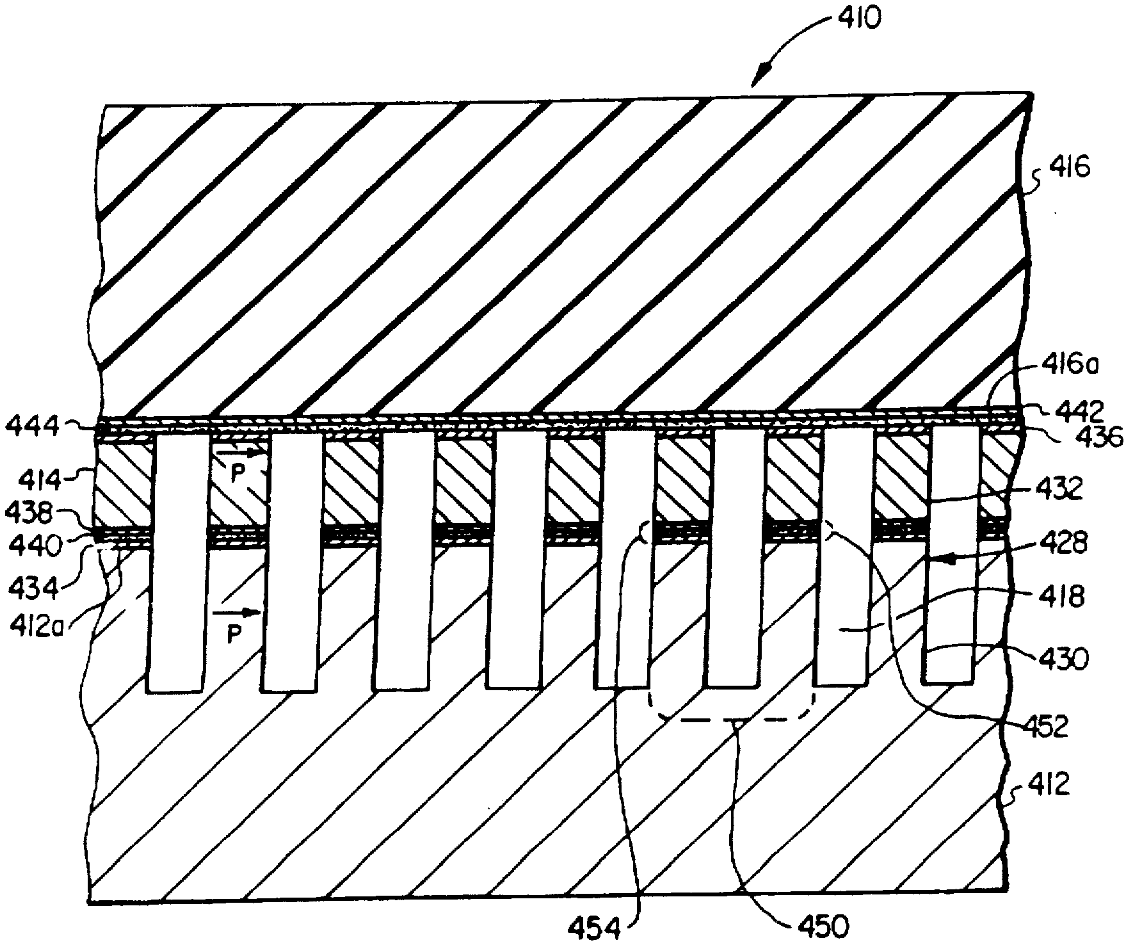
FIG. 12 is a partial cross-sectional view of another alternate embodiment of the ink jet printhead of FIG. 1 taken along lines 12—12.

Referring next to FIG. 12, yet another embodiment of the invention may now be seen. In this embodiment of the invention, the ink jet printhead 410 is formed from an intermediate body portion 414 constructed identically to the intermediate body portion 14 mated and bonded to a main body portion 412. As before, the intermediate body portion 414 is constructed of piezoelectric material polarized in direction P and has metallized conductive surfaces 436, 438 provided on surfaces 414*b*, 414*a*, respectively. In this embodiment of the invention, however, the main body portion 412 is also formed of a piezoelectric material polarized in direction P and has a surface 412*a* upon which a layer of conductive material 434 is deposited thereon. The intermediate body portion 414 and the main body portion 412 are bonded together by a layer of conductive adhesive 440 which conductively mounts the metallized conductive surface 434 of the main body portion 412 and the metallized conductive surface of the intermediate body portion 414 together. Alternately, bonding between the metallized conductive surface 434 of the main body portion 412 and the metallized conductive surface 438 of the intermediate body portion 414 may be achieved by soldering the metallized conductive surfaces 434, 438 to each other. It is further contemplated that, in accordance with one aspect of the invention, one or both of the metallized conductive surfaces 434 and/or 438 may be eliminated while maintaining satisfactory operation of the invention.

After the main body portion 412 and the intermediate body portion 414 are conductively mounted together, a machining process is then utilized to form a channel array for the ink jet printhead 410. As may be seen in FIG. 12, a series of axially extending, substantially parallel channels 418 are formed by machining grooves which extend through the intermediate body portion 414 and the main body portion 412. Preferably, the machining process should be performed such that each channel 418 formed thereby should extend downwardly such that the metallized conductive surface 436, the intermediate body portion 414 of polarized piezoelectric material, the metallized conductive surface 438, the layer of conductive adhesive 440, the metallized conductive surface 434 and a portion of the main body portion 412 of polarized piezoelectric material are removed.

In this manner, the channels 418 which comprise the channel array for the ink jet printhead and sidewall actuators 428, each having a first, sidewall actuator section 430 and a second sidewall actuator section 432, which define the sides of the channels 418 are formed. As to be more fully described below, by forming the parallel channel array in the manner herein described, a generally U-shaped sidewall actuator 450 (illustrated in phantom in FIG. 12) which comprises the first sidewall actuator sections 430 on opposite sides of a channel 418 and a part of the main body portion 412 which interconnects the first sidewall actuator sections 430 on opposite sides of the channel 418 is provided for each of the channels 418.

Continuing to refer to FIG. 12, the channel array for the ink jet printhead is formed by conductively mounting a third block 416 of unpolarized piezoelectric material, or other inactive material, having a single layer of metallized conductive surface 442 formed on the bottom surface 416*a* thereof to the metallized conductive surface 436 of the intermediate body portion 414. The third block 416, which hereafter shall be referred to as the top body portion 416 of the ink jet printhead, may be constructed in a manner similar to that previously described with respect to the top body portion 16. To complete assembly of the channel array for the ink jet printhead, the metallized conductive surface 442 of the top body portion 416 is conductively mounted to the metallized conductive surface 436 of the second sidewall section 432 by a second layer of conductive adhesive 444. Preferably, the layer of conductive adhesive 444 should be spread over the metallized conductive surface 42 and the top body portion 416 then be placed onto the metallized conductive surface 436. As before, it is contemplated that, in one embodiment of the invention, either one or both of the metallized conductive surfaces 436 or 442 may be eliminated while maintaining satisfactory operation of the high density ink jet printhead.

To electrically connect the parallel channel array illustrated in FIG. 12 such that a generally U-shaped actuator 450 is provided for each of said channels 418, a electrical contact 452, which, in alternate embodiments of the invention may be the metallized conductive surfaces 436 and 438 conductively mounted to each other by the conductive adhesive 440, the metallized conductive surfaces 436 and 438 soldered to each other, or a single layer of conductive adhesive which attaches surfaces 412*a* and 414*a* to each other, on one side of the channel 418 is connected to +1 V. voltage source (not shown). A second electrical contact 454 is then connected to a −1 V. voltage source. To complete the electrical connections for the parallel channel array, the layer of conductive adhesive 444 is connected to ground. In this manner, the channel 18 shall have a generally U-shaped actuator 450 having a 2 V. voltage drop between the contact 452 and the contact 454, a first sidewall actuator having a +1 V. voltage drop between the contact 452 and ground, and a second sidewall actuator having a −1 V. voltage drop between the contact 454 and ground. Once constructed in this manner, when a +, −, +, − voltage pattern is applied to the contacts 405 to cause every other channel 418 to eject a droplet of ink upon the application of voltage, significantly greater compressive and/or expansive forces on the channel 418 are produced by the combination U-shaped actuator 450 and the pair of sidewall actuators 432 that border the channel 418 than that exerted on the channel 18 by the sidewall actuators 28.

While the dimensions of a high density ink jet printhead having a parallel channel array with a U-shaped actuator for each channel may be readily varied without departing from the scope of the present invention, it is specifically contemplated that an ink jet printhead which embodies the present invention may be constructed to have the following dimensions:

| | |
|---|---|
| Orifice Diameter: | 40 μm |
| PZT length: | 15 mm |
| PZT height: | 356 μm |
| Channel height: | 356 μm |
| Channel width: | 91 μm |
| Sidewall width: | 81 μm |

In the embodiments of the invention described above, each sidewall actuator 30 is shared between a pair of adjacent channels 18 and may be used, therefore, to cause the ejection of ink from either one of the channel pair. For example, in FIG. 7*a*, every other channel 18*a* is being fired by displacing both sidewall actuators 30 which form the sidewalls for the fired channels 18*a* such that those channels are compressed. The channels 18*b* adjacent to the fired channels 18*a* remain unfired. However, as each sidewall actuator 30 is shared between a fired channel 18*a* and an unfired channel 18*b*, the sidewall actuators 30 which form the sidewalls for the unfired channels 18*b*, are also displace,d although not in an manner which would cause the ejection of ink therefrom. The pressure pulse produced in the unfired channels 18*b* by the displacement of the sidewall actuators 30 necessary to actuate the fired channels 18*a* is commonly referred to as "cross-talk". Under certain conditions such as the use of low ink viscosity and low surface tension ink, the cross-talk produced by the sidewall actuators 30 in the unfired channels 18*b* located adjacent to the fired channels 18*a* may result in an unwanted actuation of the unfired channel 18*b*.

Figure 13A:
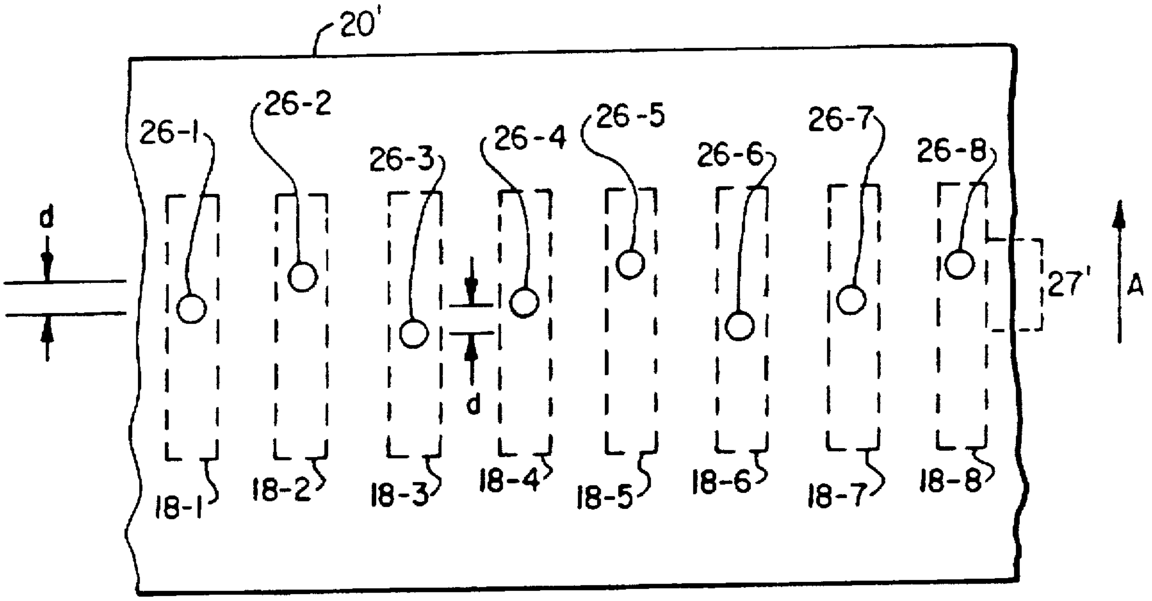
FIG. 13*a* is an enlarged partial front view of yet another alternate embodiment of the ink jet printhead of FIG. 1.
Figure 13B:
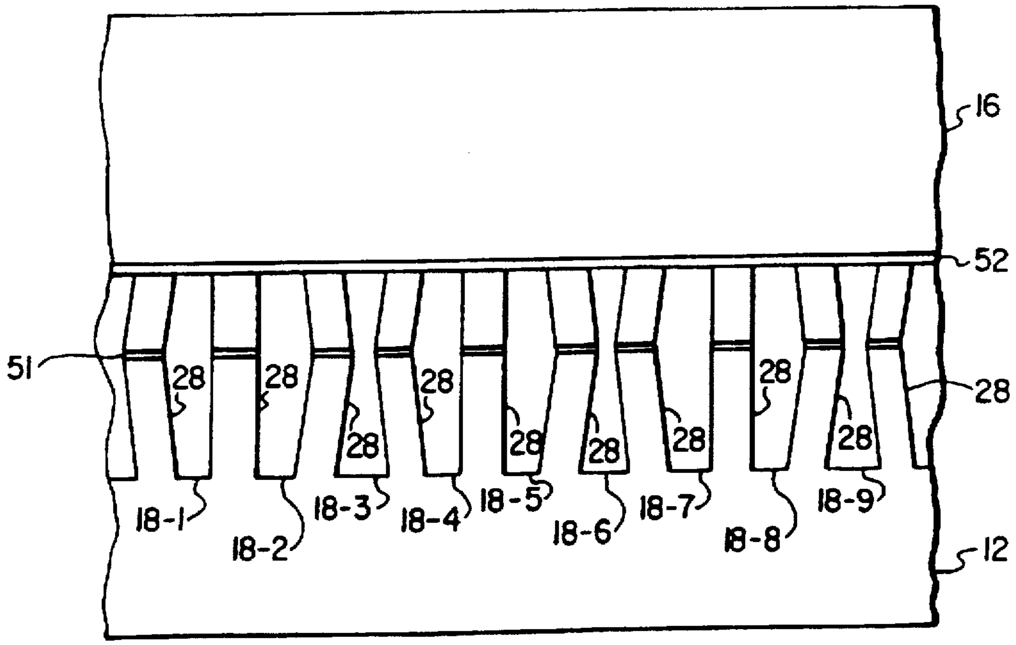
FIG. 13*b* is a second front view of the ink jet printhead of FIG. 13*a* with front wall removed and after a first deflection of a deflection sequence for the actuator sidewalls of the parallel channel array.
Figure 13C:
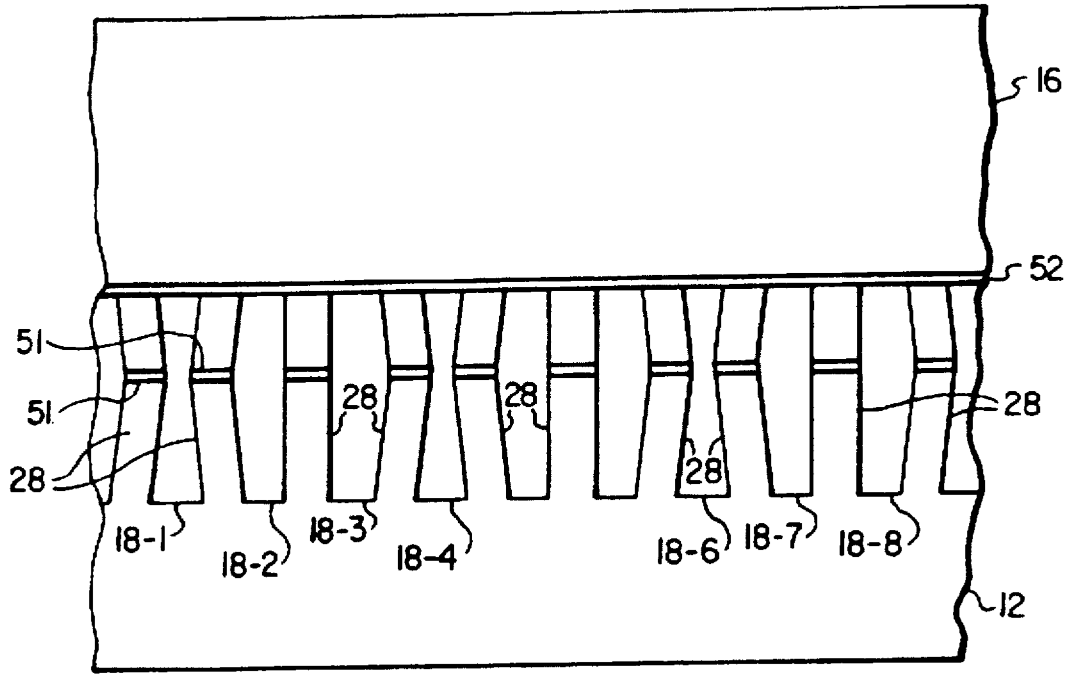
FIG. 13*c* is the ink jet printhead of FIG. 13*b* after a second deflection of the deflection sequence.
Figure 13D:
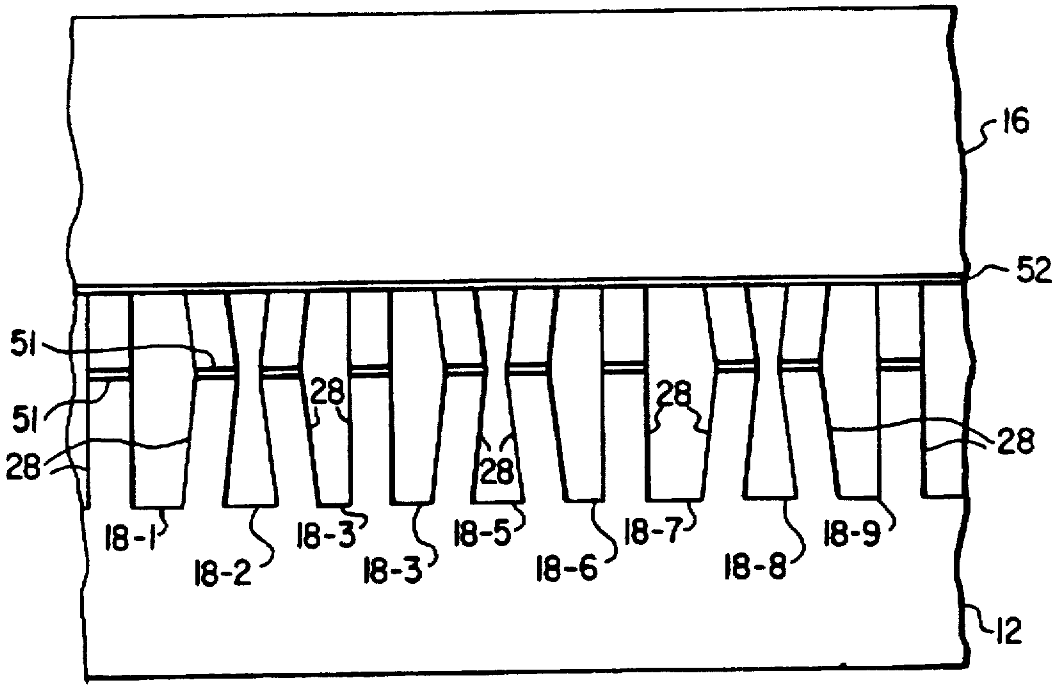
FIG. 13*d* is the ink jet printhead of FIG. 13*b* after a third deflection of the deflection sequence.

Referring next to FIG. 13*a*, a schematic illustration of an alternate embodiment of the front wall portion 20" of the ink jet printhead 10 of FIG. 1 which may be utilized to eliminate or reduce cross-talk produced during the operation of the ink jet printhead 10 of FIG. 7*a* shall now be described in greater detail. In this embodiment of the invention, an orifice array 27" is comprised of orifices 26-1, 26-2, 26-3, 26-4, 26-5, 26-6, 26-7 and 26-8 disposed in a slanted array configuration. More specifically, each of the orifices 26-1 through 26-8 extends through the cover 20" to communicate with a corresponding channel 18-1, 18-2, 183, 18-4, 18-5, 18-6, 18-7, 18-8, respectively, of the ink jet printhead 10 and are grouped together such that each orifice 26-1 through 26-8 in a particular group is positioned a distance "d", which, in one embodiment of the invention, is approximately equal to ⅓ pixel, in motion direction "a" from the adjacent orifice also included in that particular group. For example, in the orifice array 27 illustrated in FIG. 13*a*, the orifices 26-1 and 26-22; 26-3, 26-4 and 26-5; and 26-6, 26-7 and 26-8 form first, second and third orifice groups, respectively. During the operation of the ink jet printhead 10 constructed in accordance with the present invention and having an orifice array such as that illustrated in FIG. 13*a*, orifices 26-1, 26-4 and 26-7, which are positioned in a first row, would be fired together, 26-2, 26-5 and 26-8, which are positioned in a second row, would be fired together, and 26-3, 26-6 and 26-9, which are positioned in a third row, would be fired together, by compressing the sidewall actuators 28 (not shown in FIG. 13) which define the sidewalls of the fired channels. By firing the orifices 26-1 through 26-8 in this manner, cross-talk effects are minimized. Specifically, at t=1 (see FIG. 13*b*), both sidewalls 28 which define the channels 18-3, 18-6 and 18-9 (which correspond to a first row of orifices 26-3, 26-6 and 269) are actuated simultaneously by placing a positive voltage drop across the second sidewall sections 32 in the manner previously described with respect to FIG. 7*a*. In response thereto, the channels 18-3, 18-6, 18-9 are compressed, thereby imparting a pressure pulse to the ink within the channels to cause the ejection of a drop of ink therefrom. The likelihood of unwanted actuation of adjacent channels 18-2, 18-4, 18-5, 18-7 and 18-8 is reduced as only one of the sidewalls 28 defining these channels have been activated, thereby reducing the magnitude of the pressure pulse imparted to the unactuated channels by one-half.

At t=2 (see FIG. 13*c*), the paper has travelled approximately ⅓ pixel in the direction "A" and the channels 18-1, 18-4 and 18-7 (which correspond to a second row of orifices 26-1, 26-4 and 26-7) located in the second row of orifices 26-1, 26-4 and 26-7) located in the second row should now be activated in a similar manner. As before, the likelihood of unwanted actuation of the channels 18-2, 18-3, 18-5, 18-6 and 18-8 is reduced due to the reduction by one-half of the magnitude of the pressure pulse imparted to the unactuated channels. Finally, at t=3 (see FIG. 13*d*), the paper has travelled above another ⅓ pixel in the direction "A"and the channels 18-2, 18-5 and 18-8 (which correspond to a third row of orifices 26-2, 26-5 and 268) located in the third row should now be activated, again in a similar manner. As before, the likelihood of unwanted actuation of the adjacent channels 18-2, 18-3, 18-4, 18-6, 18-7 and 18-9 is reduced in view of the reduction of the magnitude of the pressure pulse imparted to the unactuated channels.

As previously described, due to the large electric field necessary to polarize a strip of piezoelectric material, it is desirable to form a elongated strip of polarized piezoelectric material using a plurality of polarized "sheets". FIGS. 14–19 illustrate different embodiments of using a plurality of sheets to form a elongated strip of piezoelectric material for implementing a printhead such as those described in FIGS. 1–13.

Figure 14A:
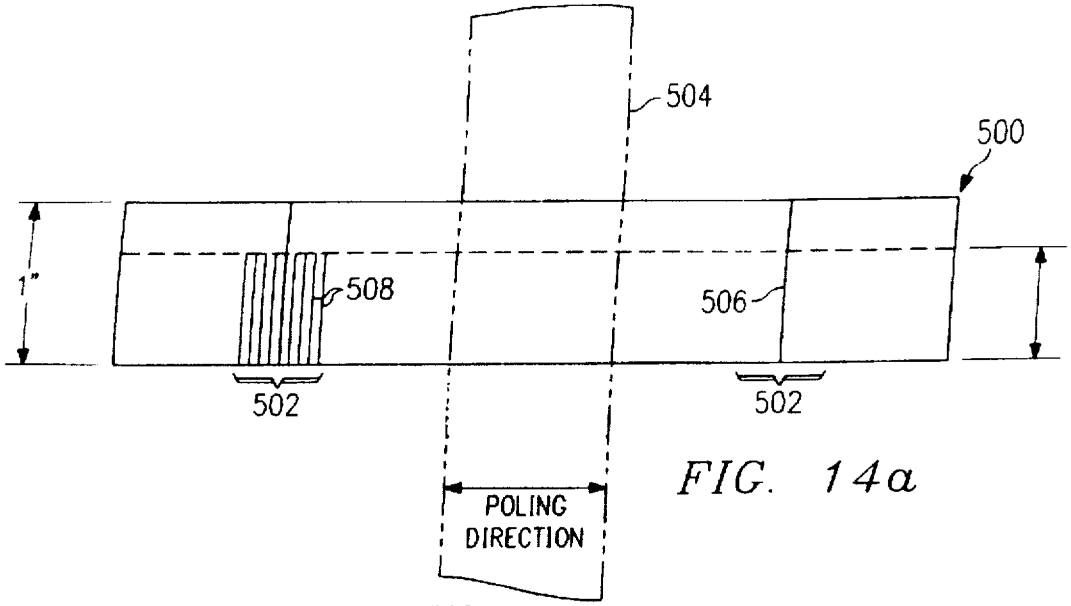
FIGS. 14*a*–*b* illustrate top and side views of a first embodiment of the present invention, with FIG. 4*a* showing the correspondence of the piezoelectric material sheets to a strip of polarized piezoelectric material.
Figure 14B:
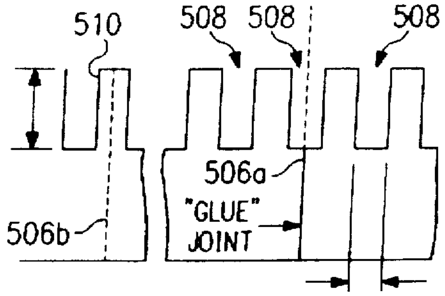

FIGS. 14*a–b* illustrate top and side views of a polarized piezoelectric bar 500 using a plurality of polarized sheets 502. In FIG. 14*a*, a top view of a band of piezoelectric material, from which the sheets are formed, is shown as superimposed by reference 504. The strips 502 are joined together, typically using a conductive or nonconductive glue joint 506. Channels 508, as discussed hereinabove, are formed in the bar, extending from the front of the bar 500 to a desired length. FIG. 14*a*, a groove length of 15–20 millimeters is shown in an overall strip width of one inch. In this specification, the width of the bar is defined as the distance from front to back of the bar 500, while the width of the sheets 502 is defined as the distance between the edges of the band 504 to be used to form the sheets 502. Although the channels 508 are shown over a small area of bar 500 for illustrative purposes, the channels would extend across the entire length of the bar 500 in a real device.

In FIG. 14*a*, the polarized piezoelectric material band 504 is cut into rectangular sheets 502. Hence, the glue joint will occur down the entire length of a channel 508, as shown by glue joint 506*a* or down the entire length of a column 510 as shown by glue joint 506*b*. Between the glue joints, the remaining columns 508 and 510 will have no glue joint; hence, the electric field used to compress or expand the channels 508 will have different electrical characteristics for jets having a glue joint disposed beneath a channel or through a column than for those jets which do not have a glue joint either in the columns or beneath the channels. Consequently, jets formed from columns 510 or channels 508 encompassing a glue joint will have different operating characteristics from the remainder of the Sets. While the effected jets comprise a very small number of the overall number of jets, it is thought that the resulting printing disparity may be noticeable.

Figure 15:
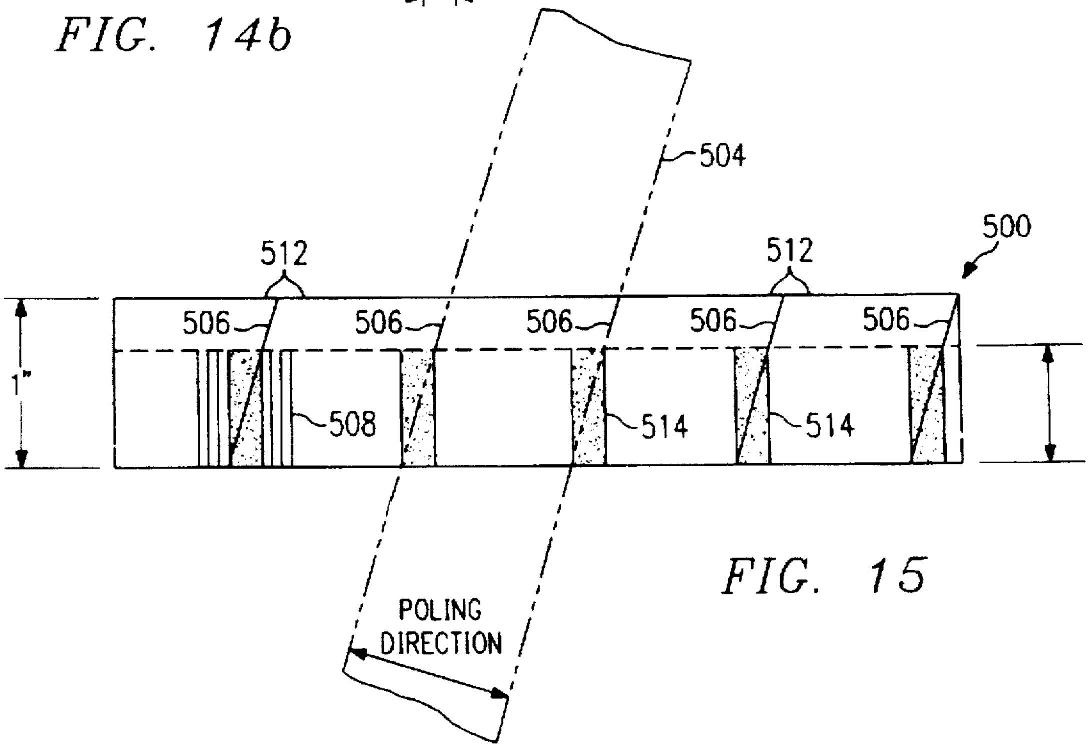
FIG. 15 illustrates a top view of a second embodiment of the present invention.

FIG. 15 illustrates a second embodiment of the invention wherein the glue joints 506 are distributed over a plurality of jets. In this embodiment, the polarized piezoelectric band 504 is used to provide sheets 512 in the shape of parallelograms, with the edges of band 504 forming the edges of the sheets which will be joined at glue joints 506. Hence, the polling direction is not normal to the direction of the channels 508. In FIG. 15, shaded portions 514 indicate the areas in which the glue joint is distributed over the jets. As can be seen, while the glue joint is distributed over a plurality of jets, thereby reducing the effect of the glue joint on any one affected jet, there is an electrical difference between jets within the shaded region 514 and jets outside of the shaded regions 514.

Nonetheless, the electrical difference between jets is less than in the embodiment shown in FIGS. 14*a–b*, and may be within acceptable performance limits. Further, since the direction of polarization is not normal to the axis of the jets, the efficiency of the system is no longer optimal. Also, the glue used to join the sheets 512 should be non-conductive to prevent the shorting of one groove to another. The advantage of this embodiment is that the polarized piezoelectric material is conserved, while the effect of the glue joints is distributed over a number of jets, thereby decreasing the variance in operating characteristics between various jets.

Figure 16:
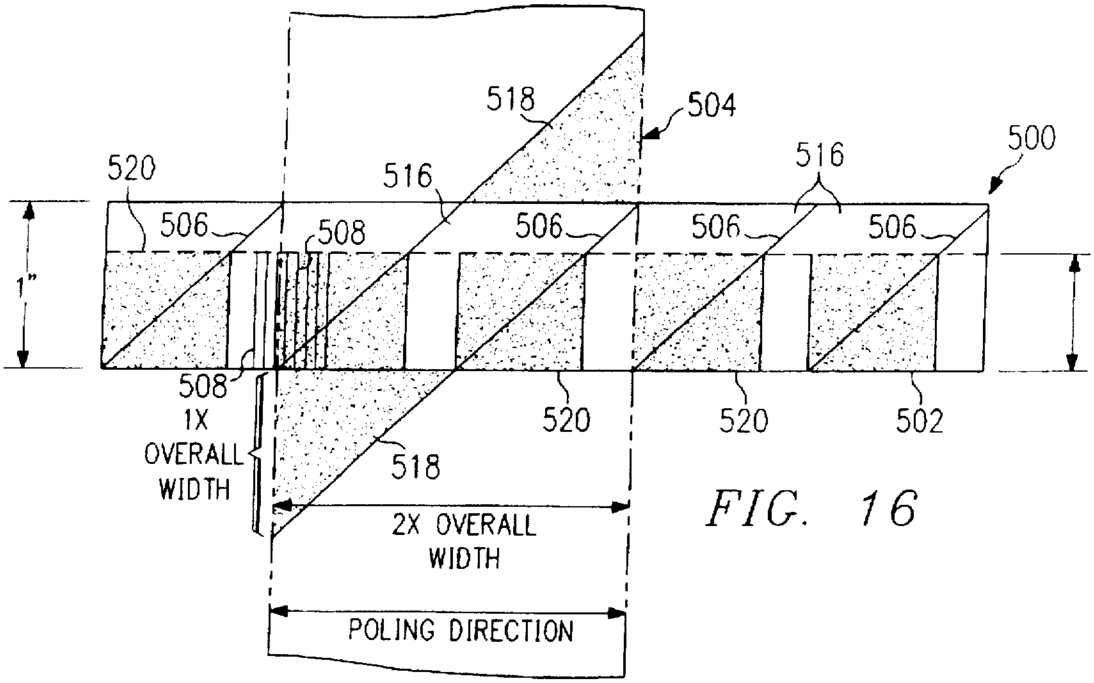
FIG. 16 illustrates a top view of a third embodiment of the present invention.

FIG. 16 illustrates a third embodiment of the present invention wherein the polarized piezoelectric band has a width equal to twice that of the overall width of the bar 500 (i.e., two inches in the illustrated embodiment) and the sheets 516 are formed by patterning the band 504 at a bias. In the embodiment shown in FIG. 16, the sheets are formed by cutting the band 504 at a 45° angle at intervals equal to the overall width of the bar 500. Excess portions 518 are removed to form the opposite sides of the parallelograms.

This embodiment has two major advantages over the embodiment shown in FIG. 15. First, the regions 520 in which the glue joints are distributed comprise a much larger portion of the bar 500 than do corresponding regions 514 shown in FIG. 15. Second, the direction of polarization is normal to the jets, thereby optimizing the efficiency of the jets. The cost, however, is that the excess portions 518 of band 504 are wasted. For reasons discussed in connection with FIG. 15, the glue used in this embodiment should be non-conductive.

Figure 17:
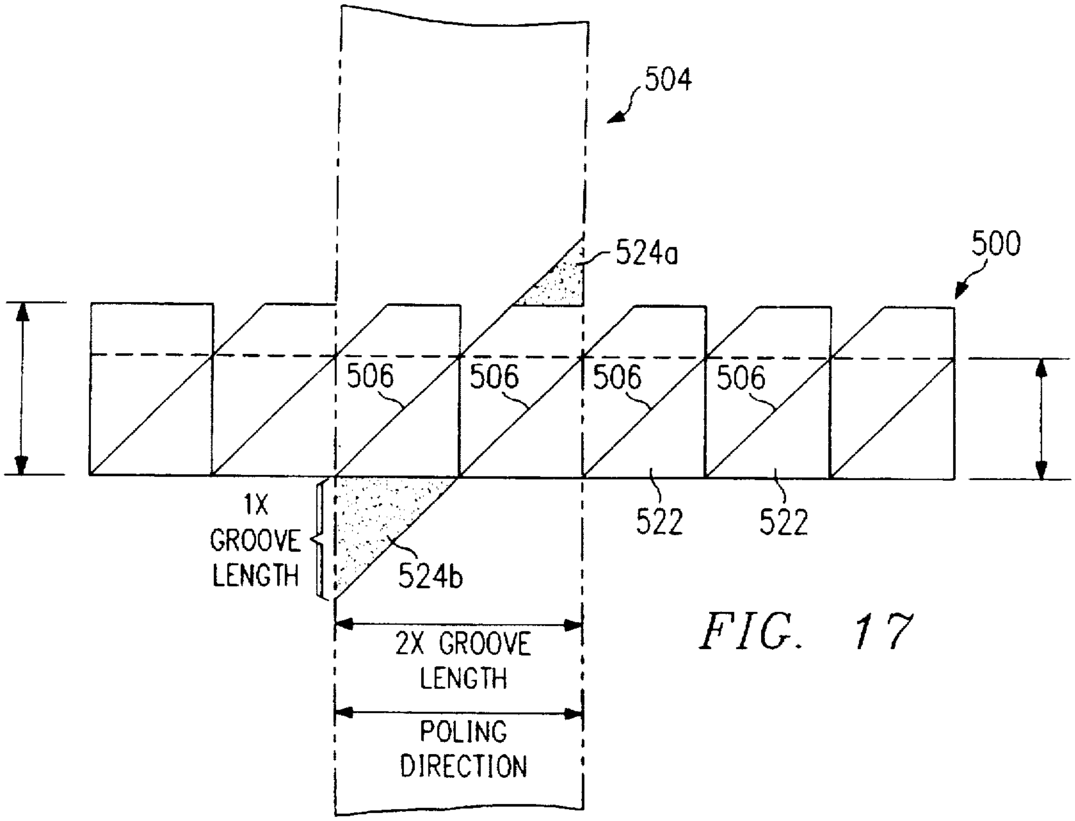
FIG. 17 illustrates a top view of a fourth embodiment of the present invention.

FIG. 17 illustrates a fourth embodiment of the present invention, where the width of the polarized piezoelectric material band 504 is equal to two times the groove length (i.e., 30–40 millimeters) and the sheets 522 are formed as shown in FIG. 16 with the exception that each strip cut from band 504 has a height equal to the groove length, rather than the overall width of bar 500. This embodiment has a significant advantage over the embodiment of FIG. 16; namely, each jet in the strip 500 is identically affected by the glue joints 506 which are equally distributed among the jets. While all ink jets include glue joints, and the polarization is normal to the jets, the width of the bar 500 is nonuniform. The amount of excess piezoelectric material shown in excess regions 524*a–b* is less than the excess piezoelectric material shown in FIG. 16; however, this embodiment would require another strip of piezoelectric material glued to the top surface in order for the device to work.

Figure 18:
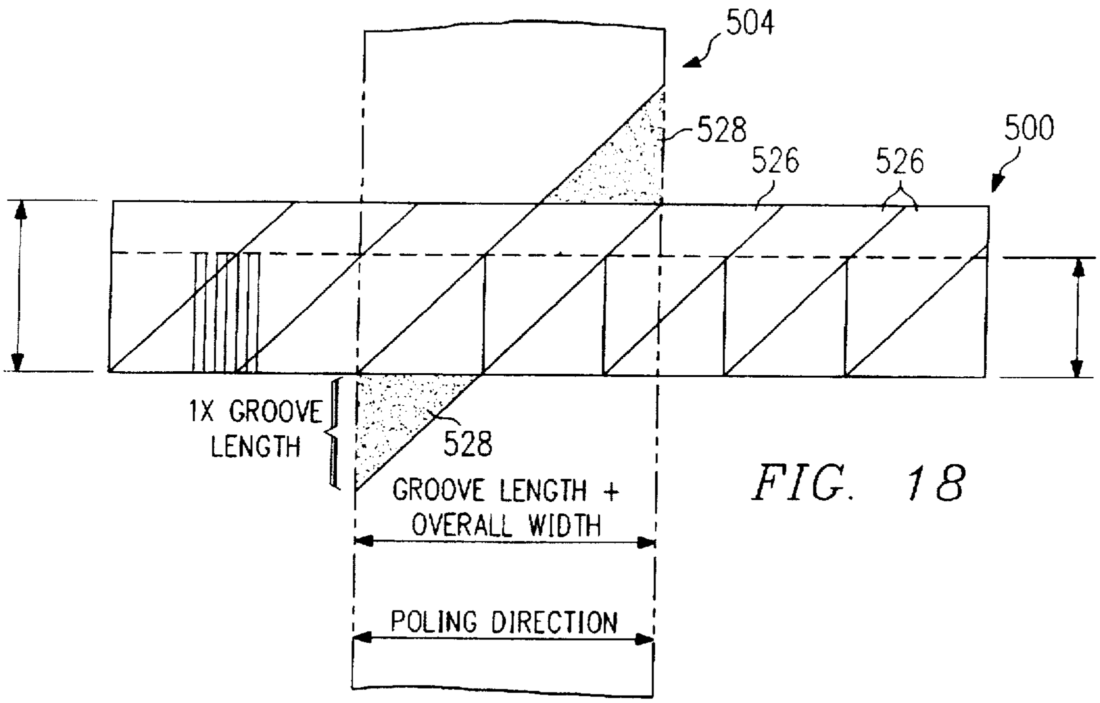
FIG. 18 illustrates a top view of a fifth embodiment of the present invention.

FIG. 18 illustrates a fifth embodiment of the present invention, where a polarized piezoelectric material band 504 is cut into diagonal strips (at 45°), with each strip having a height equal to the groove length. The width of the polarized piezoelectric material band 504 is equal to the groove length plus the overall width of the bar 500. Consequently, resulting sheets 526 may be joined such that the joints are distributed across all the jets. Thus, the jets should have essentially uniform operating characteristics. This embodiment is an improvement over the embodiment shown in FIG. 4 in that the width of the bar 500 is uniform. However, the excess material 528 for each strip is larger than the embodiment of FIG. 17; the excess material for each strip will be equal to the square of the groove length.

Figure 19:
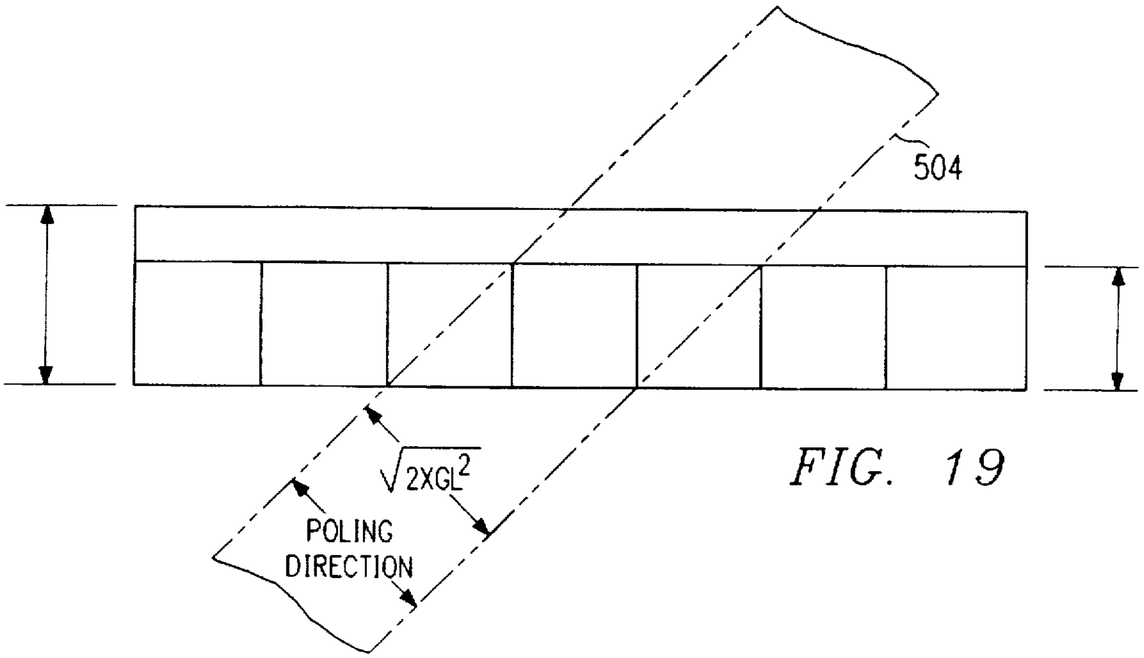
FIG. 19 illustrates a top view of a sixth embodiment of the present invention.

FIG. 19 illustrates a sixth embodiment, where the polarized piezoelectric material band 504 is disposed at an angle of 45° relative to the channels 508 in order to distribute the glue joints over more jets relative to the embodiment shown in FIG. 15. Since the direction of polarization will be at a 459 relative to the channels, this embodiment will have the poorest efficiency. However, the fabrication of the device is the simplest (except for that shown in FIGS. 14*a–b*).

While a number of embodiments for producing a ink jet printhead have been disclosed in FIGS. 14–19, the best embodiment for a particular application will depend upon the desired goals. The embodiment shown in FIG. 18 will have the most uniform operating characteristics, albeit at a cost of high production costs because of the complexity of fabrication and the amount of excess piezoelectric material used in forming the sheets 526.

On the other hand, if cost is a factor, the embodiment shown in FIGS. 14*a–b* is the easiest to fabricate, although the operating characteristics between jets will be the most notable. The remaining approaches generally involve operating characteristics and production costs between these two extremes.

Thus, there has been described and illustrated herein, an elongated printhead fabricated from sheets of polarized piezoelectric material. Those skilled in the art will recognize that many modifications and variations besides those specifically mentioned may be made in the techniques described herein without departing substantially from the concept of the present invention. Accordingly, it should be clearly understood that the form of the invention as described herein in exemplary only and is not intended as a limitation on the scope of the invention.

What is claimed is:

1. A printhead comprising:

a plurality of sheets of polarized piezoelectric material, said sheets having channels formed therein to receive ink;

a joiner disposed between said sheets to hold said sheets together, wherein said joiner comprises a non-conductive glue; and circuitry coupled to said sheets to actuate selected of said channels to eject ink.

2. The printhead of claim 1 wherein said sheets are polarized in a direction perpendicular to the channels.

3. A printhead comprising:

a plurality of sheets of polarized piezoelectric material, said sheets having channels formed therein to receive ink, wherein said sheets are polarized in a direction which forms a nonperpendicular angle with the direction of the channels;

a joiner disposed between said sheets to hold said sheets together: and circuitry coupled to said sheets to actuate selected of said channels to eject ink.

4. The printhead of claim 3 wherein said sheets are joined by joints at opposite parallel sides of said sheets.

5. The printhead of claim 4 wherein said joints are disposed perpendicular to the direction of polarization.

6. The printhead of claim 4 wherein said joints form a non-perpendicular angle with the direction of polarization.

7. The printhead of claim 6 wherein said joints form an angle of 45 degrees with the direction of polarization.

8. An ink-jet printing system comprising:

an ink-jet printhead, said ink-jet printhead comprising:

a plurality of sheets of polarized piezoelectric material, said sheets having channels formed therein to receive ink:

a joiner disposed between said sheets to hold said sheets together, wherein said joiner comprises a non-conductive glue: and circuitry coupled to said sheets to actuate selected of said channels to eject ink and thereby cause the ejection of droplets therefrom through orifices associated therewith: and a manifold for supplying ink thereto:

a controller for activating said actuating circuitry responsive to an input image signal:

an external ink conduit communicating with said manifold: and means for supplying ink to said plurality of ink-carrying channels communicating with said external ink conduit.

9. The printing system of claim 8 wherein said manifold is disposed generally perpendicularly to said channels.

10. The printing system of claim 8 wherein said sheets are polarized in a direction perpendicular to the channels.

11. An ink-jet printing system comprising:

an ink-jet printhead, said ink-jet printhead comprising:

a plurality of sheets of polarized piezoelectric material, said sheets having channels formed therein to receive ink, wherein said sheets are polarized in a direction which forms a nonperpendicular angle with the direction of the channels:

a joiner disposed between said sheets to hold said sheets together:

circuitry coupled to said sheets to actuate selected of said channels to eject ink and thereby cause the ejection of droplets therefrom through orifices associated therewith: and a manifold for supplying ink thereto:

a controller for activating said actuating circuitry responsive to an input image signal:

an external ink conduit communicating with said manifold, and means for supplying ink to said plurality of ink-carrying channels communicating with said external ink conduit.

12. The printing system of claim 11 wherein said sheets are joined by joints at opposite parallel sides of said sheets.

13. The printing system of claim 12 wherein said joints are disposed perpendicular to the direction of polarization.

14. The printing system of claim 12 wherein said joints form a nonperpendicular angle with the direction of polarization.

15. The printing system of claim 14 wherein said joints form an angle of 45 degrees with the direction of polarization.

* * * * *

UNITED STATES PATENT AND TRADEMARK OFFICE

CERTIFICATE OF CORRECTION

PATENT NO. : 5,751,318
DATED : May 12, 1998
INVENTOR(S) : Daniel B. Granzow

It is certified that error appears in the above-identified patent and that said Letters Patent is hereby corrected as shown below:

On the title page, item [73], "Compag" should read --Compaq--.

Signed and Sealed this

Twenty-first Day of July, 1998

Attest:

BRUCE LEHMAN

*Attesting Officer* *Commissioner of Patents and Trademarks*